(12) United States Patent
Kushida

(10) Patent No.: US 7,038,275 B2
(45) Date of Patent: May 2, 2006

(54) BURIED-GATE-TYPE SEMICONDUCTOR DEVICE

(75) Inventor: Tomoyoshi Kushida, Seto (JP)

(73) Assignee: Toyota Jidosha Kabushiki Kaisha, Aichi-ken (JP)

( * ) Notice: Subject to any disclaimer, the term of this patent is extended or adjusted under 35 U.S.C. 154(b) by 0 days.

(21) Appl. No.: 10/732,350

(22) Filed: Dec. 11, 2003

(65) Prior Publication Data

US 2004/0119117 A1 Jun. 24, 2004

(30) Foreign Application Priority Data

Dec. 24, 2002 (JP) ............................. 2002-371308

(51) Int. Cl.
*H01L 29/76* (2006.01)

(52) U.S. Cl. ...................... 257/342; 257/328; 257/329; 257/335; 257/341; 257/505; 257/506; 257/520

(58) Field of Classification Search ................ 257/328, 257/329, 335, 341, 505, 506, 520
See application file for complete search history.

(56) References Cited

U.S. PATENT DOCUMENTS

| | | | |
|---|---|---|---|
| 5,998,837 | A | 12/1999 | Williams |
| 6,060,731 | A | 5/2000 | Murata et al. |
| 6,194,741 | B1 | 2/2001 | Kinzer et al. |
| 6,476,443 | B1 | 11/2002 | Kinzer |
| 6,878,989 | B1 * | 4/2005 | Izumisawa et al. ......... 257/328 |
| 2002/0043684 | A1 | 4/2002 | Kubo |

FOREIGN PATENT DOCUMENTS

| | | |
|---|---|---|
| JP | 2000-58823 | 2/2000 |
| JP | 2002-100770 | 4/2002 |

OTHER PUBLICATIONS

European Search Report dated Nov. 3, 2005.

* cited by examiner

*Primary Examiner*—Mai-Huong Tran
(74) *Attorney, Agent, or Firm*—Finnegan, Henderson, Farabow, Garrett & Dunner, LLP

(57) ABSTRACT

An object of this invention is to provide a buried gate-type semiconductor device in which its gate interval is minimized so as to improve channel concentration thereby realizing low ON-resistance, voltage-resistance depression due to convergence of electrical fields in the vicinity of the bottom of the gate is prevented and further prevention of voltage-resistance depression and OFF characteristic are achieved at the same time. A plurality of gate electrodes 106 each having a rectangular section are disposed in its plan section. The interval 106T between the long sides of the gate electrodes 106 is made shorter than the interval 106S between the short sides thereof. Further, a belt-like contact opening 108 is provided between the short sides of the gate electrode 106, so that P⁺ source region 100 and N⁺ source region 104 are in contact with a source electrode. Consequently, the interval 106T between the long sides of the gate electrode 106 can be set up regardless of the width of the contact opening 108.

20 Claims, 31 Drawing Sheets

DEPLETION LAYER

BURIED-GATE-TYPE SEMICONDUCTOR DEVICE

BACKGROUND OF THE INVENTION

1. Field of the Invention

The present invention relates to a semiconductor device provided with buried gates. More particularly, it relates to a buried-gate-type semiconductor device of which gate interval is shortened as much as possible so as to enhance channel concentration and lower ON-resistance, and relates to a buried-gate-type semiconductor device that intends to prevent a decline in voltage-resistance caused by local concentration of electrical field around bottom portion of gates. The inventive buried-gate-type semiconductor device is efficient especially to a high voltage-resistance power semiconductor device.

2. Description of Related Art

There have conventionally been used buried-gate-type semiconductor devices for power supply and the like (e.g., an insulated-gate-type bipolar transistor disclosed in JP Laid-open Patent Publication No. 2002-100770). Some of conventional buried-gate-type semiconductors of this kind are of stripe type in which zonal buried gates are arranged in parallel to one another. FIG. 50 and FIG. 51 show an example of a stripe type. FIG. 51 is a sectional view of portion A—A in FIG. 50. FIG. 50 is a sectional view of portion E—E in FIG. 51. This buried-gate-type semiconductor device has trench-type gate electrodes. The buried-gate-type semiconductor device generally structured such that source regions and gate electrodes are arranged on a surface side of its semiconductor substrate (an upper surface in FIG. 51) and a drain region and the like are arranged on other surface side of the substrate (a lower surface in FIG. 51).

That is, trench-type gate electrodes 906, $P^+$ source regions 900 and $N^+$ source regions 904 are arranged on the upper surface side of the semiconductor substrate. Gate electrodes 906 are insulated from the semiconductor substrate by gate dielectrics 905 and an interlayer dielectric 907. On the above of those, there are arranged a source electrode 909. The source electrode 909 is in contact with the semiconductor substrate at zonal contact openings 908 in parallel to gate electrodes 906. Thereby, the source electrode 909 is in contact with both $P^+$ source regions 900 and $N^+$ source regions 904. Beneath $P^+$ source regions 900 and $N^+$ source regions 904, there are arranged P channel regions 903. The bottom level of P channel regions 903 is shallower than that of gate electrodes 906.

Beneath P channel regions 903, there is formed an N drift region 902. Most part of the N drift region 902 is deeper than the bottom level of gate electrodes 906 and extends to almost entirety of the semiconductor substrate. Further beneath the N drift region 902, there is arranged a $P^+$ drain region 901. There is formed a drain electrode 910 in contact with the $P^+$ drain region 901 further beneath it. In this buried-gate-type semiconductor device, a range indicated with an arrow Y in FIG. 50 corresponds to a unit repeated in a vertical direction in FIG. 50. Furthermore, a range indicated with an arrow X in FIG. 50 corresponds to a unit repeated in a horizontal direction in FIG. 50. A unit X repeated in a horizontal direction is a sum of a range 906W occupied by a gate electrode 906 and gate dielectric 905 and a range 906S occupied by an $N^+$ source region 904 and the like.

FIG. 52 and FIG. 53 show another example of a buried-gate-type semiconductor device of this kind. The buried-gate-type semiconductor device shown in FIG. 52 and FIG. 53 is a variant of the buried-gate-type semiconductor device directed to FIG. 50 and FIG. 51. That is, gate electrode 906 is formed in cross striped shape in plane sectional view. A quadrangle-shaped contact opening 908 is arranged on center of each square and furthermore, a $P^+$ source region 900 is made to be in contact with a source electrode 909 at the center of a contact opening 908. Out of section of a portion A—A of this buried-gate-type semiconductor device directed to FIG. 52, a range indicated with an arrow K is same as FIG. 51. FIG. 53 is an elevation sectional view of portion H—H in FIG. 52.

FIG. 54 shows another conventional semiconductor device details of which are a little different from the buried-gate type semiconductor devices shown in FIG. 50 through FIG. 53. The semiconductor device directed to FIG. 54 includes $P^+$ gate regions 800 arranged within its semiconductor substrate. That is, this semiconductor device is not an insulated-gate type but a junction-gate type.

However, the buried-gate-type semiconductor device directed to FIG. 50 and FIG. 51 has the following problems. That is, enhancement of channel concentration is limited. This is because intervals 906S between adjoining gate electrodes 906 cannot be made so small. In this semiconductor device, zonal contact openings 908 are arranged between adjoining gate electrodes 906 and a $P^+$ source region 900 is arranged within each contact opening 908. Therefore, an interval 906S needs a distance that is same as or lager than a sum of: two mating allowances 900M for a $P^+$ source region 900 and a contact opening 908 arranged at both sides of a 900W, a width of a $P^+$ source region 900 itself; and two mating allowance 906M for a contact opening 908 and a gate dielectric 905. Therefore, a minimum dimension of an interval 906S between adjoining gate electrodes 906 is large. This aspect limits enhancement of channel concentration, i.e., lowering of ON-resistance. Furthermore, in case gate electrodes 906 and the source electrode 909 are short-circuited and voltage is applied to the drain electrode 910 with reference to the short-circuited electrodes, electrical field concentrates at shoulder portions, cross portions of bottom surfaces and side surfaces of gate electrodes 906 (an arrow L in FIG. 51). Therefore, voltage-resistance lowers, which is problematic.

This kind of problem is even more serious for a semiconductor device directed to FIG. 52 and FIG. 53 that has a cross striped gate electrode 906. This is because depth at crossing portions of a gate electrode 906 is deeper than other portions of that, as apparent from the elevation sectional view of FIG. 53. Therefore, concentration of electrical fields is more intense at crossing portions of a gate electrode 906. Due to manufacturing process reason, it is inevitable for a gate electrode 906 which has such crossing portions to have such convex shape at its bottom surface. That is, etching gas for digging trenches is supplied to crossing portions of which effective width is wide more than to other portion.

Voltage-resistance is not so problematic for a junction-type semiconductor device as shown in FIG. 54. However, there is another problem such that normally-OFF characteristic cannot be obtained by voltage control for a junction-type semiconductor device. That is, in case positive voltage is applied to $P^+$ gate regions 800 not insulated, holes are injected to the N drift region 802 from $P^+$ gate regions 800. As a result, current flows between a source electrode 809 and a drain electrode 810. Therefore, current control is required for such a semiconductor device to obtain normally-OFF characteristic.

SUMMARY OF THE INVENTION

The present invention has been made to resolve problems of the above mentioned conventional buried-gate-type semiconductor devices. That is, the first resolution is to provide a buried-gate-type semiconductor device of which gate interval is shortened as much as possible so as to enhance channel concentration and lower ON-resistance. The second resolution is to provide a buried-gate-type semiconductor device that intends to prevent a decline in voltage-resistance caused by local concentration of electrical field around bottom portions of gate electrodes. Furthermore, the present invention intends to provide a buried-gate-type semiconductor device that can achieve both prevention of voltage-resistance decline and preferable OFF characteristic.

To achieve the object, according to one aspect of the present invention, there is provided a buried-gate-type semiconductor device comprising: a semiconductor substrate; a first one-conduction-type semiconductor region formed in the semiconductor substrate; a first other-conduction-type semiconductor region formed above of the first one-conduction-type semiconductor region; a plurality of buried gates buried in the semiconductor substrate penetrating the first other-conduction-type semiconductor region, the buried gates having long sides and short sides intersecting to one another in a section parallel to a surface of the semiconductor substrate, and being arranged repeatedly along at least short-side direction; a second one-conduction-type semiconductor region formed at a surface side of the first other-conduction-type semiconductor region; a second other-conduction-type semiconductor region having a bottom portion deeper than a bottom portion of buried gates, the second other-conduction-type semiconductor region being at least formed at a side portion of a buried gate's short side; and a wiring layer, wherein a contact portion at which the second one-conduction-type semiconductor region and the wiring layer are in contact with each other is arranged at a buried gate's short side. In the present invention, "semiconductor substrate" is equivalent to an entire monocrystal semiconductor of both a semiconductor generally provided as a wafer and semiconductor layers formed on the wafer by means of epitaxial growth or the like.

In such a structure buried-gate-type semiconductor device, a second other-conduction-type semiconductor region is formed more deeply than a buried gate. Therefore, electrical field applied between a buried gate and a semiconductor region around the buried gate is relaxed. Thereby, voltage-resistance is enhanced. Especially, it is better for a second other-conduction-type semiconductor region to cover a shoulder portion that is a cross portion of a side surface at a side of a buried gate's short side and a bottom surface of the buried gate. A shoulder portion there is a portion where electrical field is likely to concentrate while a buried-gate-type semiconductor device is being used. Such a portion is covered with the second other-conduction-type semiconductor region so as to relax concentration of electrical field. Thereby, there is achieved a buried-gate-type semiconductor device of which voltage-resistance is high.

According to a second aspect of the present invention, there is provided a buried-gate-type semiconductor device comprising: a semiconductor substrate; a first one-conduction-type semiconductor region formed in the semiconductor substrate; a channel semiconductor region of other-conduction-type formed above of the first one-conduction-type semiconductor region; a plurality of buried gates buried in the semiconductor substrate penetrating the channel semiconductor region, the buried gates having long sides and short sides intersecting to one another in a section parallel to a surface of the semiconductor substrate, and being arranged repeatedly at least along short-side direction; a second one-conduction-type semiconductor region formed at a surface side of the channel semiconductor region; an embedded other-conduction-type semiconductor region having a bottom portion deeper than a bottom portion of buried gates, the embedded other-conduction-type semiconductor region being at least formed at a side portion of a buried gate's short side; and a wiring layer, wherein a contact portion at which the second one-conduction-type semiconductor region and the wiring layer are in contact with each other is arranged at a buried gate's short side.

In the semiconductor device directed to the second aspect, bottom level of an embedded other-conduction-type semiconductor region is deeper than that of a buried gate. Therefore, electrical field applied to a portion between a buried gate and a semiconductor region around the buried gate is relaxed. Needless to say, in this semiconductor device also, it is better for an embedded other-conduction-type semiconductor region to cover a shoulder portion that is a cross portion of a side surface at a side of a buried gate's short side and a bottom surface of the buried gate. Furthermore, channel concentration can be enhanced in case of this semiconductor device.

According to a third aspect of the present invention, there is provided a buried-gate-type semiconductor device comprising: a semiconductor substrate; a first one-conduction-type semiconductor region formed in the semiconductor substrate; a channel semiconductor region formed above of the first one-conduction-type semiconductor region; a plurality of buried gates buried in the semiconductor substrate penetrating the channel semiconductor region, the buried gates having long sides and short sides intersecting to one another in a section parallel to a surface of the semiconductor substrate, and being arranged repeatedly at least along short-side direction; a second one-conduction-type semiconductor region formed at a surface side of the channel semiconductor region; a gate-side-portion other-conduction-type semiconductor region having a bottom portion deeper than a bottom portion of buried gates, the gate-side-portion other-conduction-type semiconductor region being at least formed at a side portion of a buried gate's short side; and a wiring layer, wherein a contact portion at which the second one-conduction-type semiconductor region and the wiring layer are in contact with each other is arranged at a buried gate's short side, impurity concentration at between buried gates in the channel semiconductor region is lower than impurity concentration at the first one-conduction-type semiconductor region, and entirety of the channel semiconductor region gets depleted in case applied voltage to buried gates is 0 or opposite bias.

In case of the semiconductor device directed to the third aspect, a channel semiconductor region may be either one-conduction-type or other-conduction-type. Both types can achieve enhancement of voltage-resistance and channel concentration, and obtain good OFF characteristic. The entirety of a channel region gets depleted when applied voltage to a buried gate is 0 or opposite bias, whereby normally-OFF characteristic can be obtained. That is, this semiconductor device works as a normally-OFF-type electrostatic-indication-type transistor. On the other hand, current flows in the entirety of a channel semiconductor region under ON operation state. Therefore there is little loss under ON state, which is another advantageous aspect.

According to a fourth aspect of the present invention, there is provided a buried-gate-type semiconductor device comprising: a semiconductor substrate; a first one-conduction-type semiconductor region formed in the semiconductor substrate; a channel semiconductor region formed above of the first one-conduction-type semiconductor region; a buried gate facing to the channel semiconductor region, the buried gate being formed to reach the first one-conduction-type semiconductor region; and an other-conduction-type semiconductor region formed in the semiconductor substrate, the other-conduction-type semiconductor region having a bottom portion deeper than a bottom portion of the buried gate and facing to the buried gate.

According to the forth aspect, a shallow buried gate and a deep other-conduction-type semiconductor region are used together, whereby concentration of electrical field to a bottom surface of a buried gate (especially, a shoulder portion at a wall surface) is relaxed. Thereby, there can be provided a buried-gate-type semiconductor device that is free from voltage-resistance depression. It is preferable that a channel semiconductor region and an other-conduction-type semiconductor region are in contact with each other. Potential of an other-conduction-type semiconductor region is same as source potential under operation state. Since an other-conduction-type semiconductor region is in contact with a channel semiconductor region, a channel semiconductor region is likely to get depleted even though potential of a buried gate is 0V. Furthermore, current to due to carriers flowing in from a source side is cut out due to built-in potential of an other-conduction-type semiconductor region.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

DETAILED DESCRIPTION OF THE PREFERRED EMBODIMENTS

Hereinafter, preferred embodiments of the buried gate-type semiconductor device will be described in detail with reference to the accompanying drawings.

First Embodiment

Figure 1:
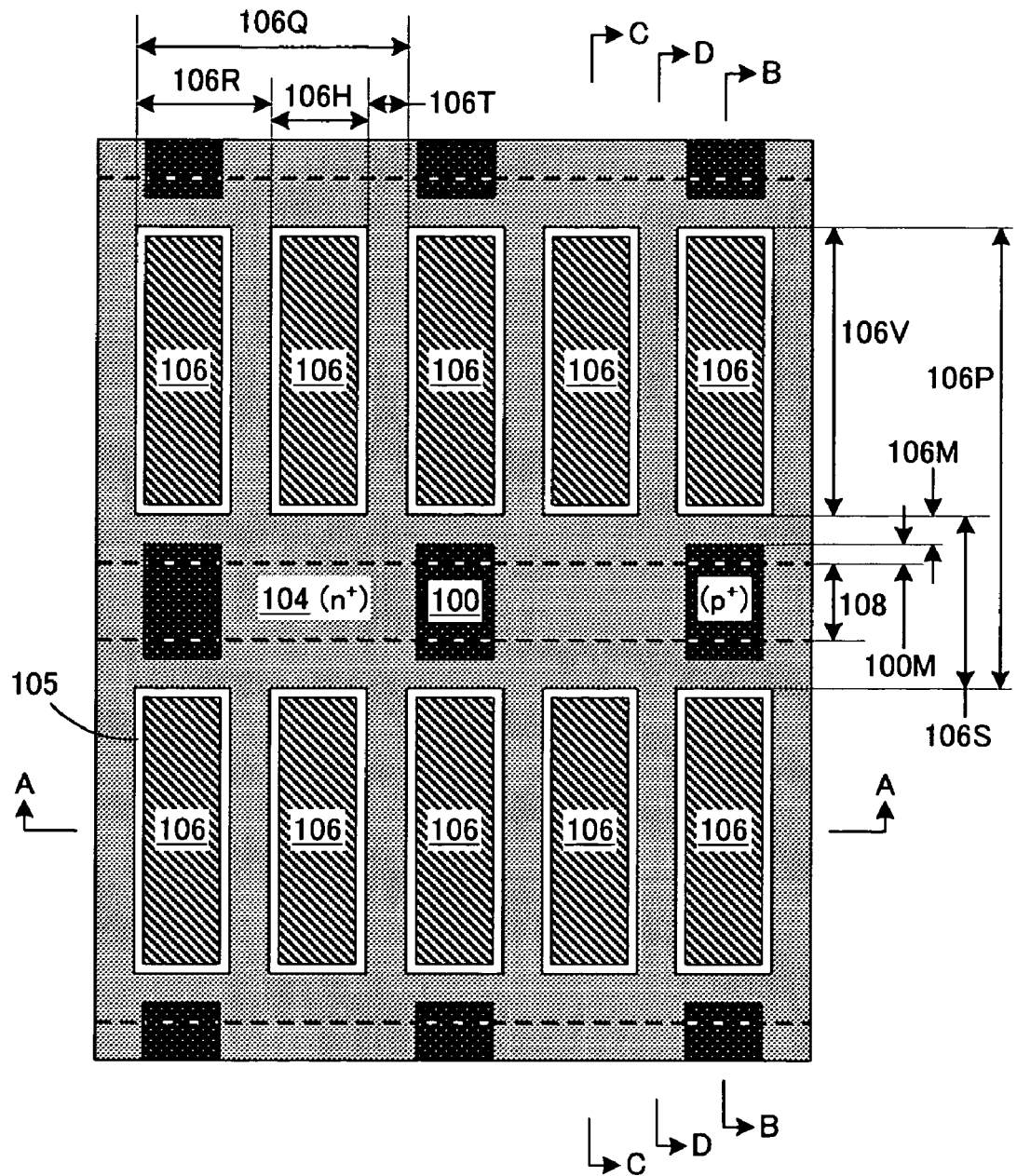
FIG. 1 is a plane sectional view (portion E—E) of structure of a field-effect-type semiconductor device (power MOS) directed to a first embodiment.
Figure 2:
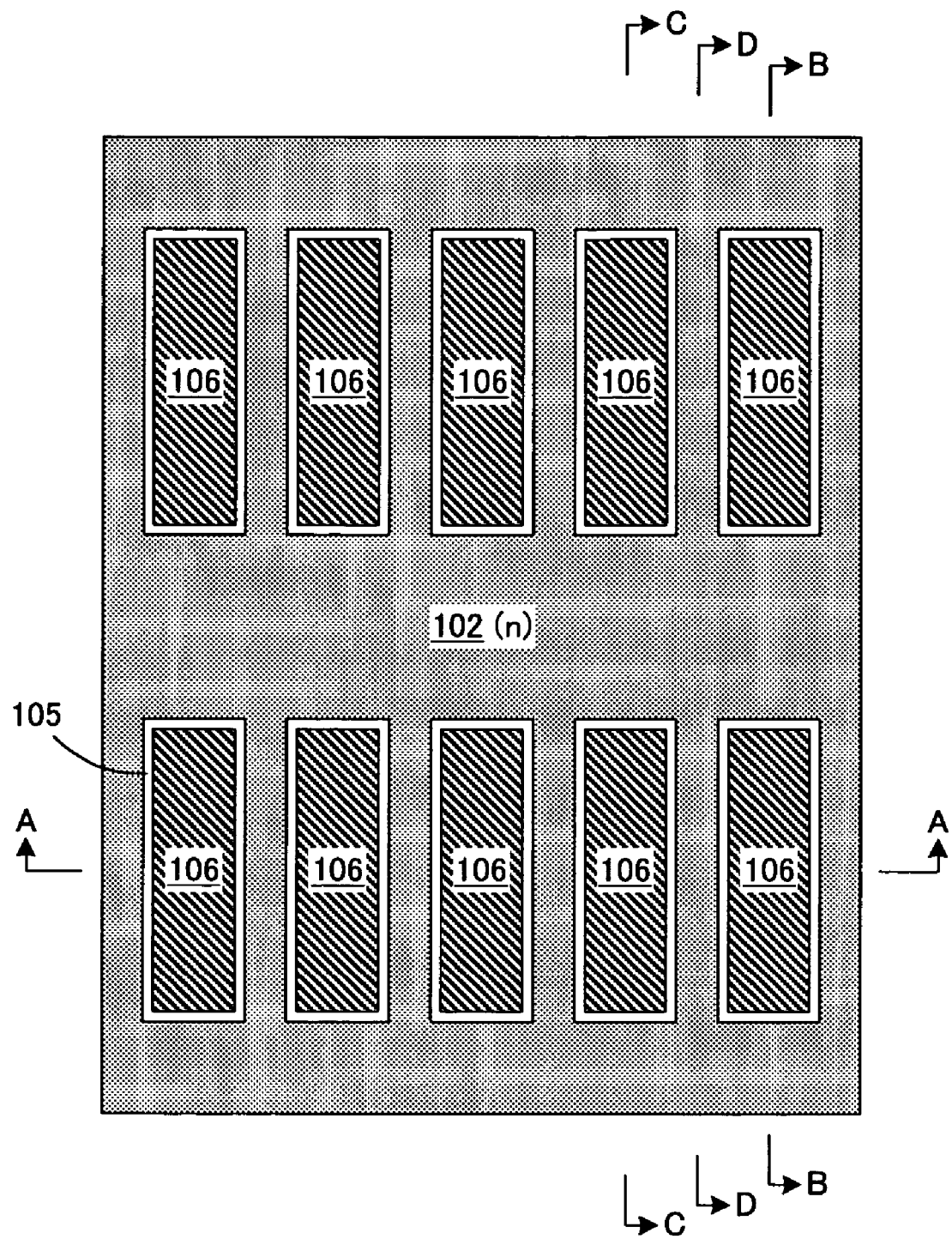
FIG. 2 is a plane sectional view (portion F—F) of structure of the field-effect-type semiconductor device (power MOS) directed to the first embodiment.
Figure 3:
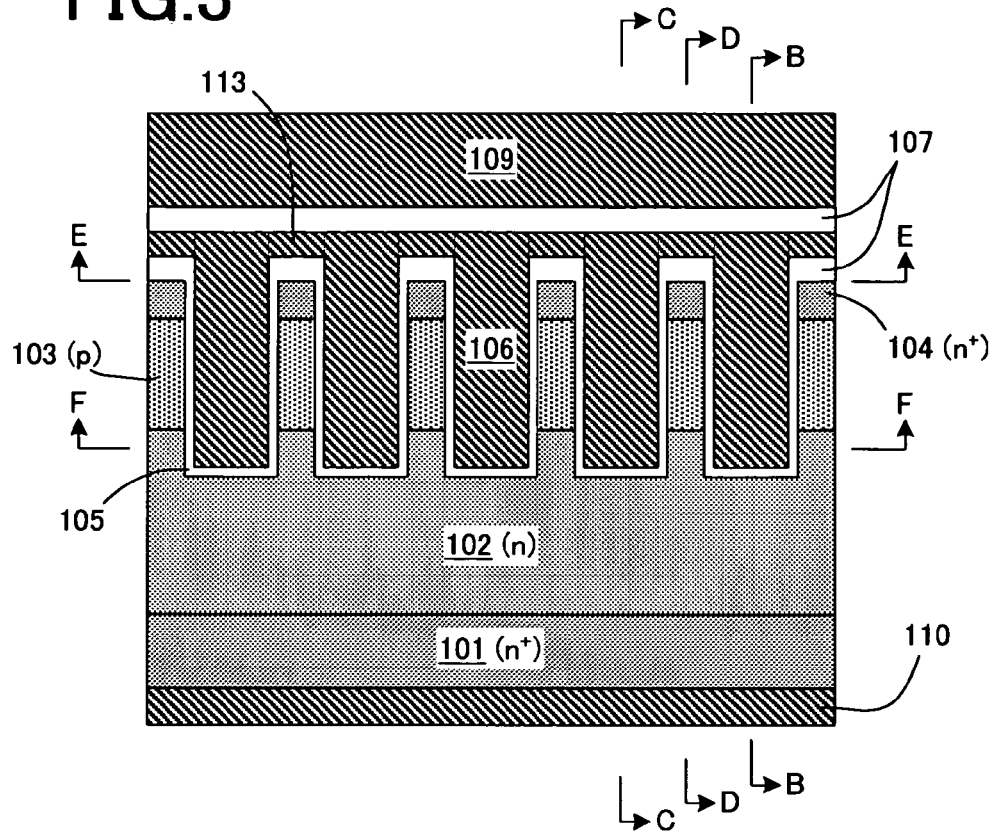
FIG. 3 is an elevation sectional view (portion A—A) of structure of the field-effect-type semiconductor device (power MOS) directed to the first embodiment.
Figure 4:
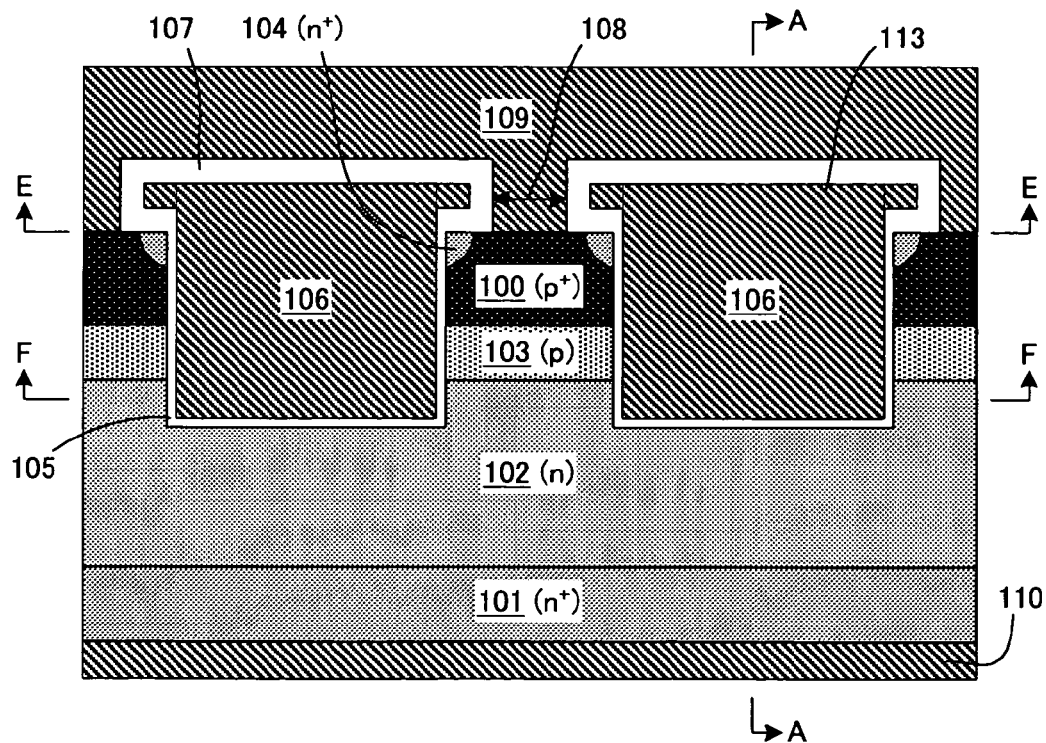
FIG. 4 is an elevation sectional view (portion B—B) of structure of the field-effect-type semiconductor device (power MOS) directed to the first embodiment.
Figure 5:
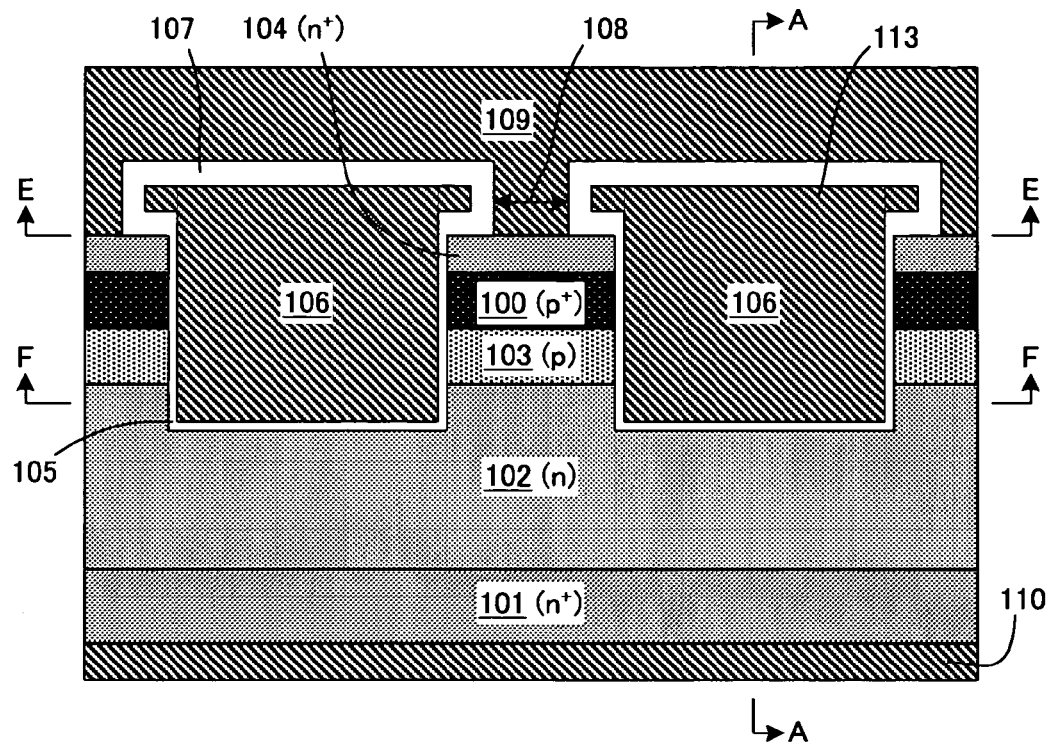
FIG. 5 is an elevation sectional view (portion C—C) of structure of the field-effect-type semiconductor device (power MOS) directed to the first embodiment.
Figure 6:
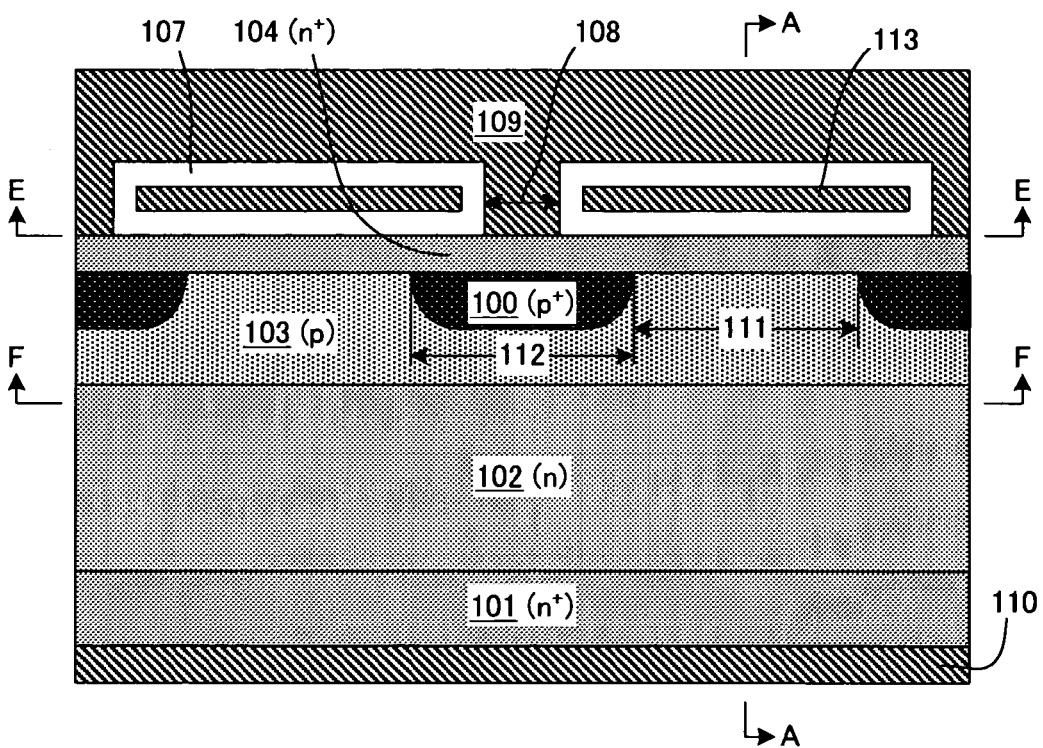
FIG. 6 is an elevation sectional view (portion D—D) of structure of the field-effect-type semiconductor device (power MOS) directed to the first embodiment.

The first embodiment is a field-effect-type semiconductor device having trench-type insulated gates according to an embodiment of the present invention. FIG. 1 through FIG. 6 show the structure of the field-effect-type semiconductor device according to the first embodiment. FIG. 3 is a sectional view of a portion A—A in FIG. 1 and FIG. 2. FIG. 4 is a sectional view of a portion B—B in FIG. 1 and FIG. 2. FIG. 5 is a sectional view of a portion C—C in FIG. 1 and FIG. 2. FIG. 6 is a sectional view of a portion D—D in FIG. 1 and FIG. 2. FIG. 1 is a sectional view of a portion E—E (this level is called "surface" of the semiconductor substrate in this specification) in FIG. 3 through FIG. 6. FIG. 2 is a sectional view of a portion F—F in FIG. 3 through FIG. 6.

This field-effect-type semiconductor device is so constructed as to function as a power MOS. This field-effect-type semiconductor device has a structure in which one side face of the semiconductor substrate (top face in FIG. 3 through FIG. 6, that is, the aforementioned surface) is provided with source regions and gate electrodes while the other side face (bottom face in FIG. 3 through FIG. 6, which will be referred to as "bottom surface") is provided with a drain region and the like.

That is, trench-structured gate electrodes 106, $P^+$ source regions 100 and an $N^+$ source region 104 are provided on the surface side of the semiconductor substrate. Gate electrodes 106 are insulated from the semiconductor substrate by gate dielectrics 105 and an interlayer dielectric 107. Within the interlayer dielectric 107, there is provided a gate wiring 113 for operating the voltage of gate electrodes 106. As shown in FIG. 3 through FIG. 6, a P channel region 103 is provided so as to oppose gate electrodes 106 below the $P^+$ source region 100 and the $N^+$ source region 104. A gate dielectric 105 is between a P channel region 103 and a gate electrode 106. The bottom end of the P channel region 103 is shallower than the bottom end of gate electrodes 106. A source electrode 109 is provided above $P^+$ source regions 100, the N+ source region 104 and gate electrodes 106. The source electrode 109 is in contact with both P+ source regions 100 and the N+ source region 104.

An N drift region 102 is formed below the P channel region 103. Most of the N drift region 102 is located at a deeper position than the bottom end of gate electrodes 106 while being continuous through almost the entire semiconductor substrate. An N+ drain region 101 is provided further below the N drift region 102. A drain electrode 110 is formed on the bottom surface side of the semiconductor substrate such that it is in contact with a bottom of the N+ drain region 101.

In the field-effect-type semiconductor device of this embodiment, as shown in FIG. 1 and FIG. 2, a plurality of gate electrodes 106 are formed such that they have a rectangular sectional shape parallel to surface. The gate electrodes 106 are disposed in a grid configuration. The interval 106T between adjoining long sides of gate electrodes 106 is shorter than the interval 106S between short sides thereof. As shown in FIG. 3 through FIG. 6, the gate electrodes 106 are provided to penetrate P+ source regions 100, the N+ source region 104 and the P channel region 103. The bottom end of gate electrodes 106 cut into the N drift region 102.

As shown in FIG. 1, areas in which P+ source regions 100 face the surface of the semiconductor substrate are provided between the short sides of alternate gate electrodes 106 disposed side by side. A remaining portion of the surface of the semiconductor substrate is occupied by the N+ source region 104. As shown in FIG. 1 and FIG. 4 through FIG. 6, contact openings 108 in which the source electrode 109 is in contact with P+ source regions 100 and the N+ source region 104 are provided between the short sides of gate electrodes 106. Contact openings 108 are formed in a belt like form parallel to the short side of gate electrodes 106.

As shown in FIG. 3 through FIG. 6, the bottom end of the P+ source region 100 is deeper than the bottom end of the N+ source region 104. The bottom end of the P channel region 103 is deeper than the bottom end of P+ source regions 100. As shown in FIG. 3, and FIG. 6, P+ source regions 100 are cut off between the long sides of gate electrodes 106. There, the P channel region 103 is disposed just under the N+ source region 104 so that they are in contact. The right/left length of P+ source regions 100 in FIG. 6 is an effective P+ source region width 112 and the right/left length of a portion in which the N+ source region 104 and the P channel region 103 are in a direct contact is an effective channel width 111.

In the field-effect-type semiconductor device of this embodiment, the acceptor concentration of the P channel region 103 is as low as it can be inverted to N type by driving voltage to gate electrodes 106 and is as high as a current between the source electrode 109 and the drain electrode 110 can be blocked while off state. Then, the acceptor concentration of P+ source regions 100 is higher by about 1 digit than the acceptor concentration of the P channel region 103, so that it is not inverted by the driving voltage to gate electrodes 106.

In the field-effect-type semiconductor device of this embodiment, current between the source electrode 109 and the drain electrode 110 is controlled by applying a voltage to gate electrodes 106. That is, by applying a voltage to gate electrodes 106, conduction type in the vicinity of the surface (mainly, a face opposing the side wall of gate electrodes 106 in FIG. 3, namely, the face of the long side) of the P channel region 103 is inverted, so as to form a current path.

The configuration and arrangement of gate electrodes 106 provide a following effect. That is, in the field-effect-type semiconductor device of this embodiment, contact openings 108 are provided between the short sides of gate electrodes 106. Thus, the interval 106T between the long sides of gate electrodes 106 can be set regardless of the width of contact openings 108. Thus, sufficient channel concentration can be secured by minimizing the interval 106T from viewpoints of design.

For example, it is assumed that the minimum dimension is 0.5 µm and the mating allowance is 0.25 µm for the reason of processing capacity. In this case, the interval 106S between the short sides of gate electrodes 106 is 1.0 µm min. This is because the minimum dimension of width of contact openings 108 is 0.5 µm for the reason of the processing capacity and the mating allowance of 0.25 µm is necessary as the minimum interval (100M+106M) to the gate electrode 106S on both sides thereof. If the horizontal directional pitch 106Q in FIG. 1 is 2.0 µm and the vertical directional pitch 106P is 5.0 µm, the width 106V in the vertical direction of gate electrodes 106 is 4.0 (5.0−1.0) µm. Thus, the channel width per device area 10 µm$^2$ (2.0 µm×5.0 µm) in this case is 4.0 µm×4, namely, 16.0 µm.

Figure 50:
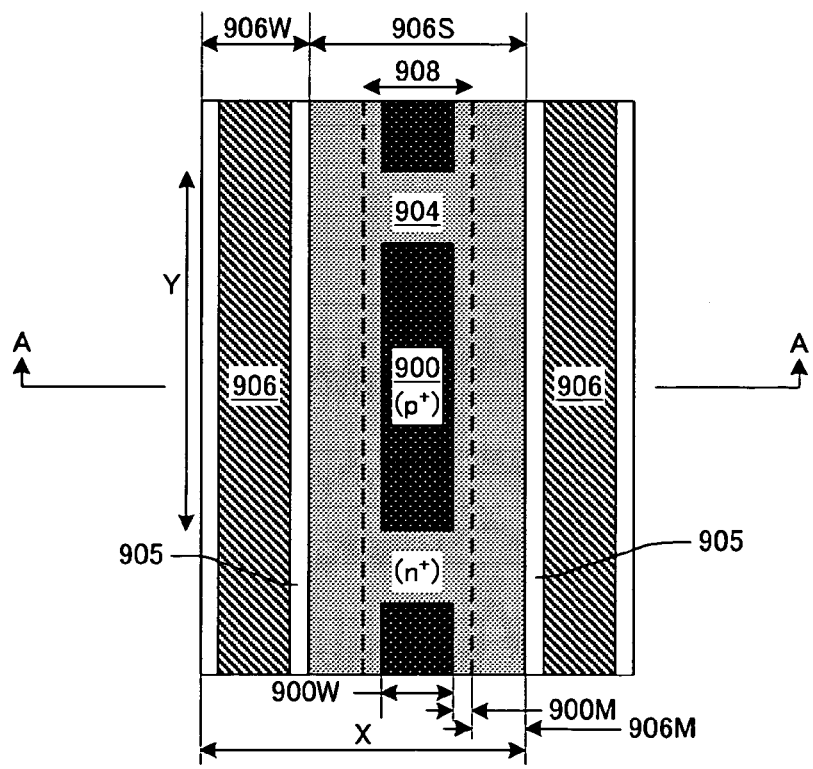
FIG. 50 is a plane sectional view (portion E—E) of structure a conventional buried-gate-type semiconductor device.
Figure 51:
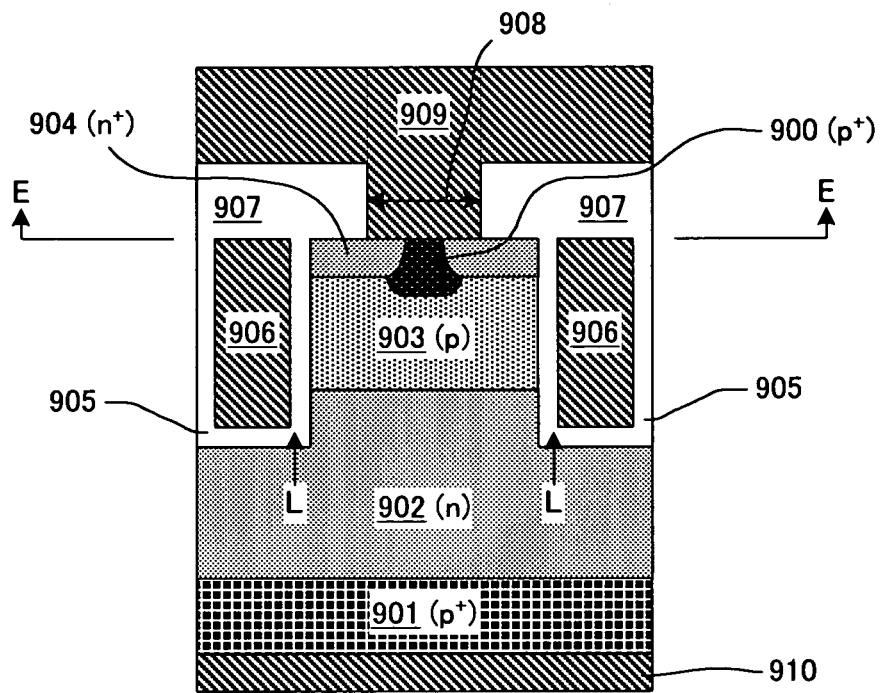
FIG. 51 is an elevation sectional view (portion A—A) of structure the conventional buried-gate-type semiconductor device.
Figure 52:
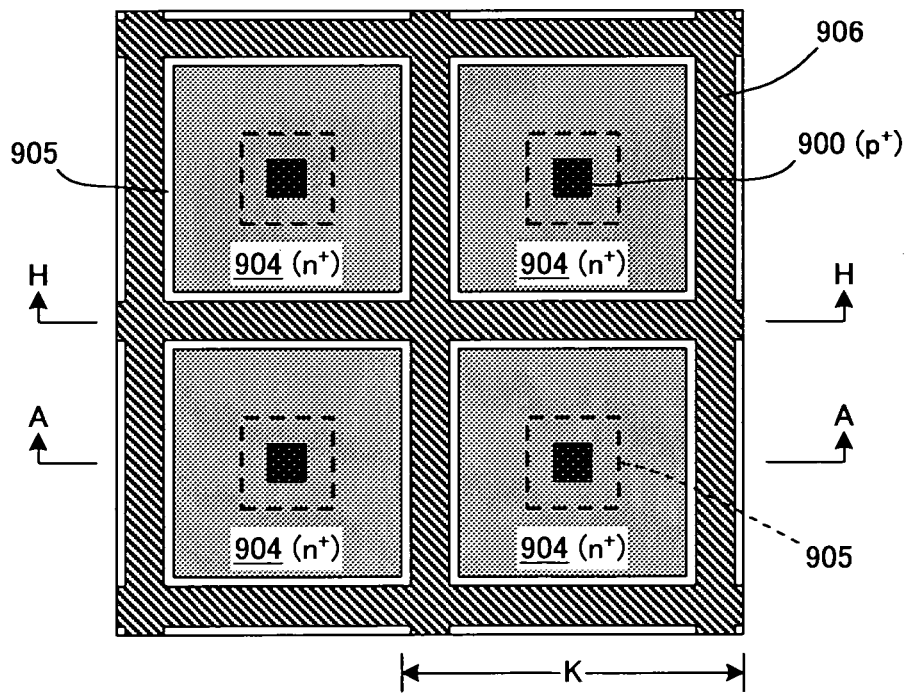
FIG. 52 is a plane sectional view (portion E—E) of structure of another conventional buried-gate-type semiconductor device.

Contrary to this, a following statement is made about the conventional type shown in FIG. 50. If both the processing capacity and the repetitive pitch in vertical and horizontal directions are equal, the channel width per device area of 10 µm$^2$ (2.0 µm×5.0 µm) is 5.0 µm×2, namely, 10.0 µm. For this reason, the field-effect-type semiconductor device of this embodiment is capable of securing a channel concentration 1.6 times under the same condition as compared to the conventional type. This means that ON resistance can be decreased by that amount. Actually, in the field-effect-type semiconductor device of this embodiment, as shown in FIG. 6, P+ source regions 100 below the N+ source region 104 are expanded a little in the right and left directions. Thus, the effective channel width 111 is a little smaller than the width 106V of the long side of the gate electrode 106. However, this is not so serious that it invalidates the above-described effect of the field-effect-type semiconductor device of this embodiment. Additionally, an influence due to a decrease in effective channel width 111 because of the expansion of P+ source regions 100 can be decreased by securing a larger width 106V in vertical and directions of the gate electrode 106. The width 106V can be increased up to about 20 µm without any problem.

Manufacturing process of the field-effect-type semiconductor device of this embodiment will be described with reference to FIG. 7 through FIG. 11. Upon manufacturing of the field-effect-type semiconductor device of this embodiment, an N+ silicon wafer having arsenic concentration of $10^{19}$ cm$^{-3}$ is employed as a starting wafer. The N+ silicon of this wafer is turned to N+ drain region 101. N type silicon layer having phosphorous concentration of $10^{14}$ cm$^{-3}$ is formed on that surface by epitaxial growth. This N type silicon layer is turned to N drift region 102. Alternatively, it is permissible to use the N type silicon wafer having phosphorous concentration of $10^{14}$ cm$^{-3}$ as a starting wafer. In that case, the N type silicon of the wafer is turned to N drift region 102. Then, the N+ drain region 101 may be formed by introducing N type impurity from the surface of the bottom side or depositing N+ silicon layer having arsenic or phosphorous concentration of $10^{19}$ cm$^{-3}$ on the surface of the bottom side.

Figure 7:
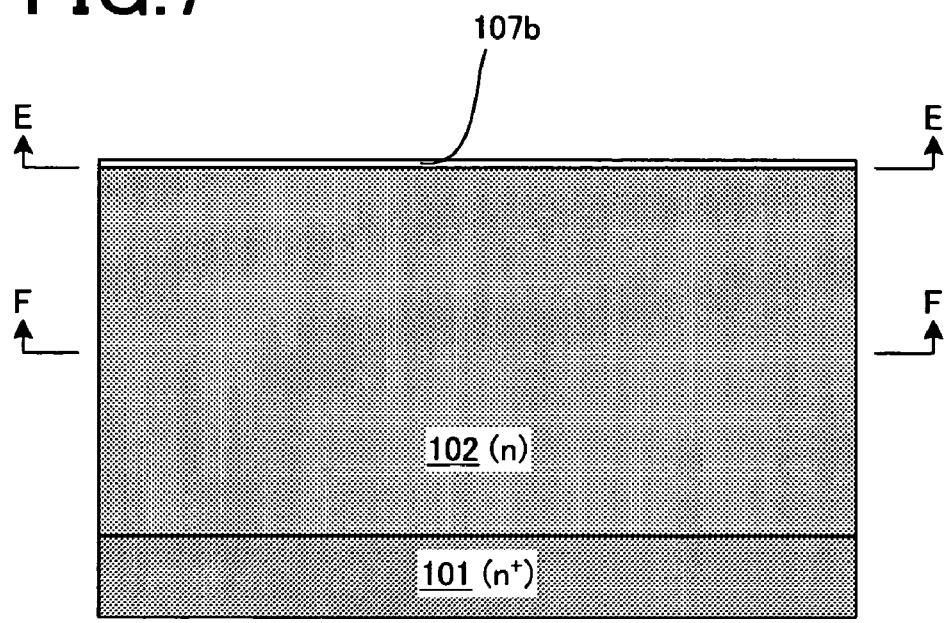
FIG. 7 is an elevation sectional view (1) showing manufacturing process of the field-effect-type semiconductor device (power MOS) directed to the first embodiment.

Next, thermal oxide film thick about 700 nm is formed on the surface of the N type silicone layer. Then, patterning is made in this thermal oxide film by photolithography and etching. As a result, only the thermal oxide film on the periphery of the wafer is left. An opening in which the N type silicon layer is exposed is formed in an entire portion in which a device will be formed. Next, a thermal oxide film 107b is formed on the surface of the N type silicone layer. The film thickness is 30 nm. FIG. 7 shows a sectional view in this state. Then, the P channel region 103 is formed by ion implantation and heat diffusion. Further, P$^+$ source regions 100 (including a P$^+$ peripheral region out of the Figure) and the N$^+$ source region 104 are formed successively by ion implantation and heat diffusion. The ion implantation processes for forming these regions are carried out via an appropriate pattern mask. Then, an oxide film 107c is deposited on the oxide 107b into a thickness of 400 nm by CVD method.

Figure 8:
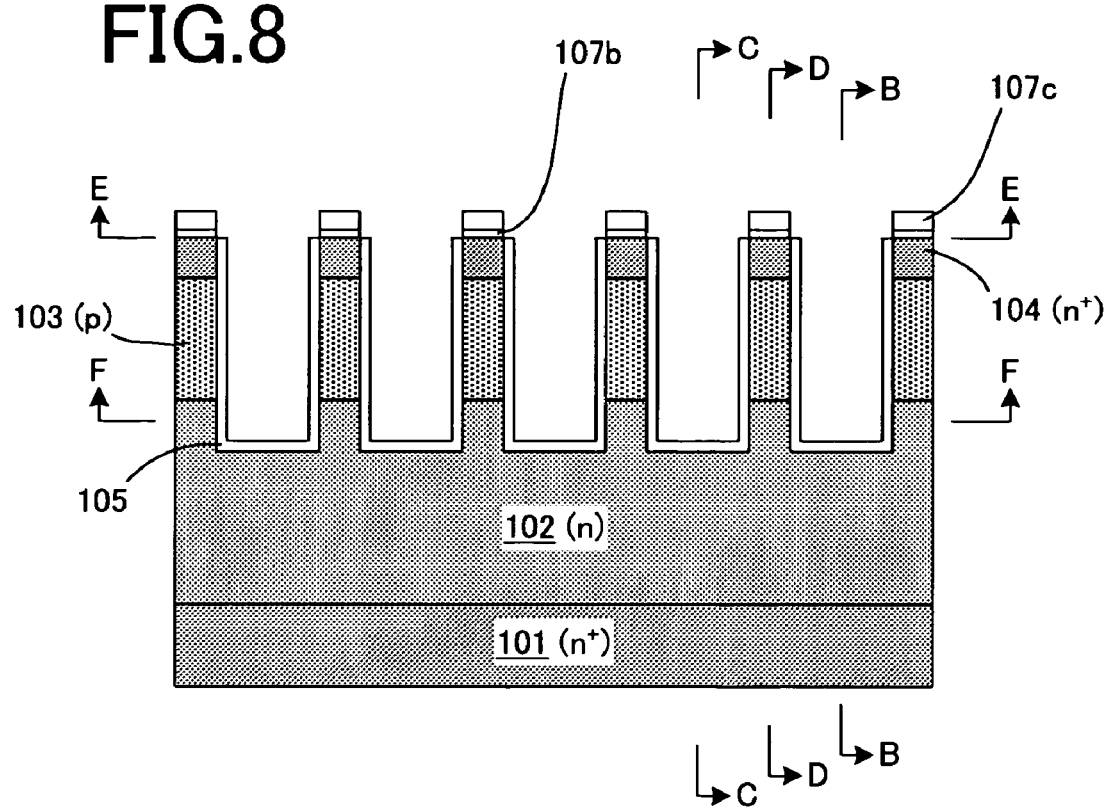
FIG. 8 is an elevation sectional view (2) of the portion A—A showing manufacturing process of the field-effect-type semiconductor device (power MOS) directed to the first embodiment.
Figure 9:
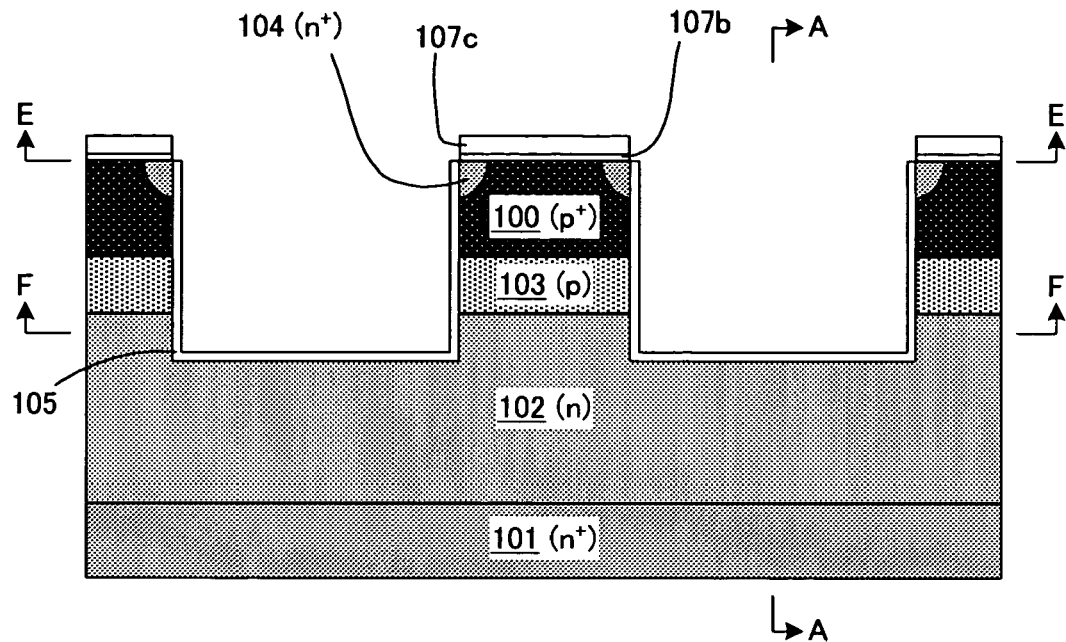
FIG. 9 is an elevation sectional view (2) of the portion B—B showing manufacturing process of the field-effect-type semiconductor device (power MOS) directed to the first embodiment.

Resist pattern is formed on that oxide film by photolithography. The resist pattern to be formed here is a pattern wherein portions in which gate electrodes 106 should be formed are openings. By using this resist pattern as a mask, the oxide films 107c and 107b are removed by dry etching. Consequently, the remaining oxide films 107c, 107b serve as mask for silicon etching. Then, by using this oxide film mask, the silicon is etched by dry etching. Consequently, trenches of 4.5 μm in depth are formed. The oxide film mask is removed by wet etching only at the device corresponding portion. After that, thermal oxide film of 100 nm in thickness is formed on the wall surface of trenches. This oxide film turns to gate dielectric 105. The sectional views in this state are shown in FIG. 8 (portion A—A) and FIG. 9 (portion B—B).

Figure 10:
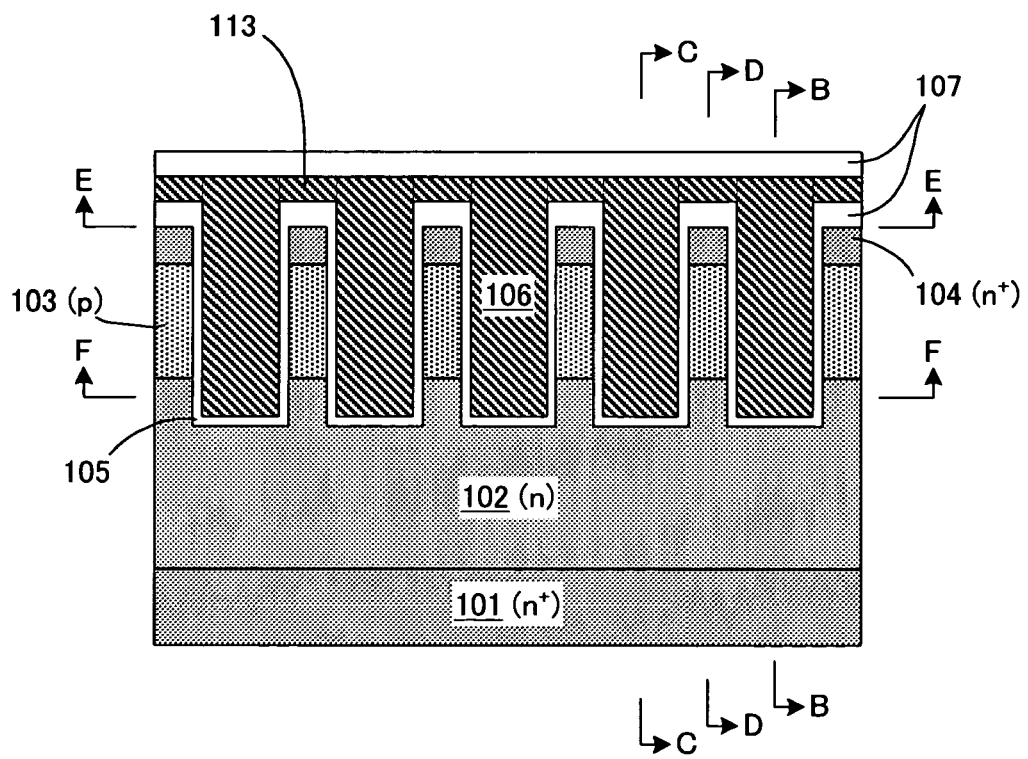
FIG. 10 is an elevation sectional view (3) of the portion A—A showing manufacturing process of the field-effect-type semiconductor device (power MOS) directed to the first embodiment.
Figure 11:
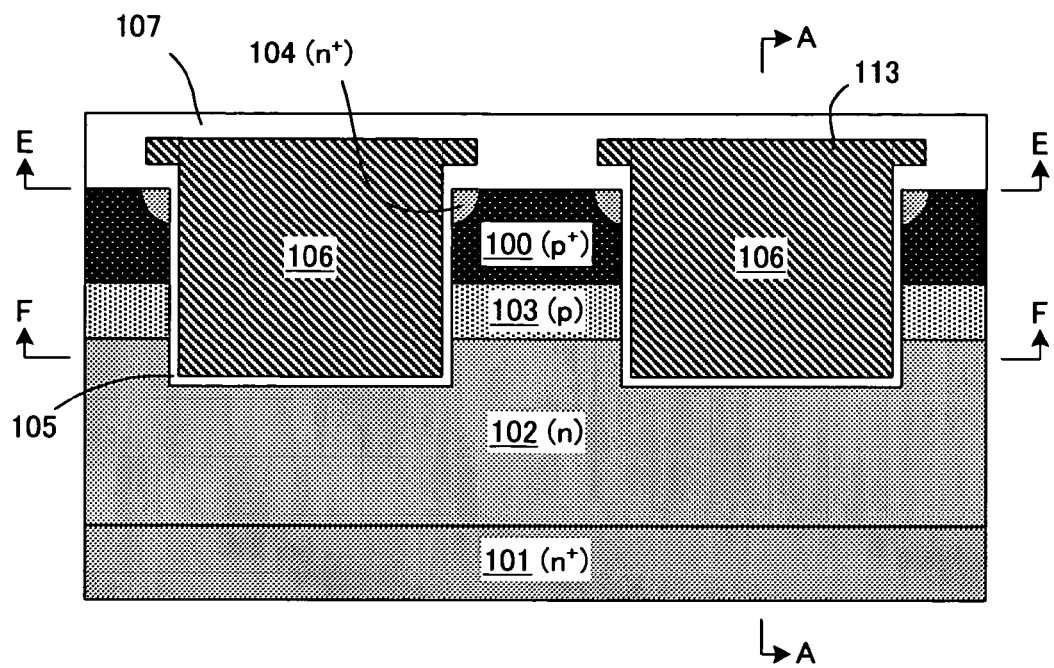
FIG. 11 is an elevation sectional view (3) of the portion B—B showing manufacturing process of the field-effect-type semiconductor device (power MOS) directed to the first embodiment.

Then, polycrystal silicon film is deposited by CVD method. Subsequently, phosphorous is diffused in the polycrystal silicon film by heat treatment under phosphorous oxychloride atmosphere. After that, excessive polycrystal silicon is removed by photolithography and etching. Polycrystal silicon to be removed is a portion above the trench opening level. However, a portion to turn to the gate wiring 113 is left. Consequently, gate electrodes 106 having trench structure and gate wiring 113 are formed. Then, oxide film is deposited on gate electrodes 106 and the like by CVD method. The film thickness is 700 nm. This oxide film turns to part of the interlayer dielectric 107. The sectional view of a portion A—A in this state is shown in FIG. 10 and the sectional view of a portion B—B is shown in FIG. 11.

Next, patterning is made to the interlayer dielectric 107 by photolithography and etching. Consequently, the interlayer dielectric 107 is removed at portions corresponding to contact openings 108 and to contact positions of the gate wiring 113. Consequently, P$^+$ source regions 100 and N$^+$ source region 104 within contact openings 108 are exposed. Additionally, contact positions of the gate wiring 113 are also exposed. Then, the source electrode 109 is formed on the exposed portion and the remaining interlayer dielectric 107 by sputtering method. Then, source electrode 109 is patterned by photolithography and etching. Upper wirings of the gate wiring 113 are also formed at this stage. Next, a drain electrode 110 is formed on the N$^+$ drain region 101 of the bottom surface by sputtering method. In this way, the field-effect-type semiconductor device of this embodiment is completed.

If an N type silicon wafer is employed as a starting wafer, the N$^+$ drain region 101 may be formed after the structure on the side of its source face (gate electrodes 106, P$^+$ source regions 100, source electrode 109 and the like) is formed.

As described in detail above, in the field-effect-type semiconductor device of this embodiment, a plurality of gate electrodes 106 having a rectangular sectional shape parallel to surface are disposed in a grid configuration. Then, the interval 106T between the long sides of gate electrodes 106 is shorter than the interval 106S between the short sides thereof and belt-like contact openings 108 are provided between the short sides in a direction perpendicular to the long side of gate electrodes 106. Consequently, such a field-effect-type semiconductor device in which the interval 106T between the long sides of gate electrodes 106 can be set up regardless of the width of contact openings 108. Therefore, by setting the interval 106T as small as the limit of the processing capacity, a field-effect-type semiconductor device in which the channel concentration per device area is much higher than the conventional type can be obtained. As a result, a field-effect-type semiconductor device whose ON resistance is very small can be obtained.

In the field-effect-type semiconductor device of this embodiment, P$^+$ source regions 100 in FIG. 1 do not have to be disposed with respect to every other gate electrode 106. P$^+$ source regions 100 may be always disposed between the short sides of gate electrodes 106 or may be disposed with respect to every two or three.

Figure 12:
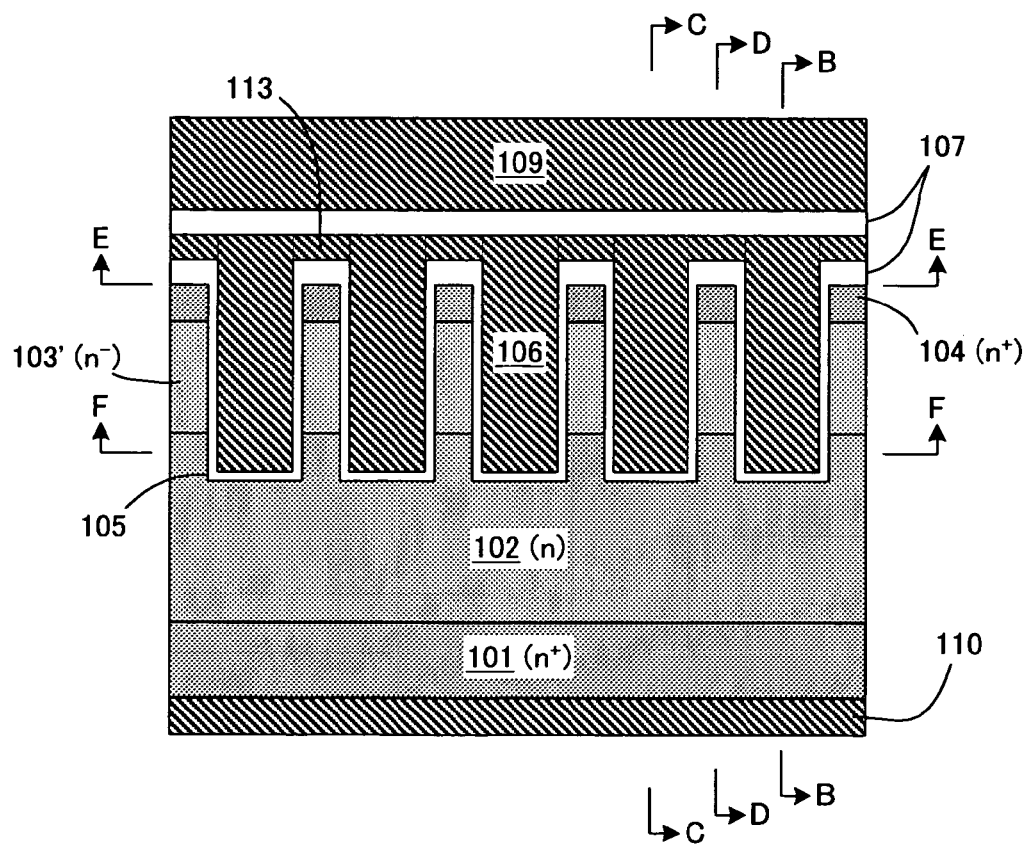
FIG. 12 is an elevation sectional view (portion A—A) of an electrostatic induction transistor of a variant directed to the first embodiment.

A variant of the field-effect-type semiconductor device of this embodiment will be described. First, an example in which the feature of this embodiment is applied to an electrostatic induction transistor will be described. This variant is achieved by providing an N channel region 103' instead of the P channel region 103. FIG. 12 shows its structure and corresponds to FIG. 3. In FIG. 4 through FIG. 6, the P channel regions 103 may be replaced with the N channel region 103'. FIG. 1 and FIG. 2 can be applied just as they are. As for the manufacturing method, the ion implantation and the like for forming the P channel region 103 are omitted.

In this electrostatic induction transistor, by setting the interval 106T between the long sides of gate electrodes 106 small, following effects can be obtained. That is, when ON, channel is formed not only in the vicinity of an interface between the N channel region 103' and the gate dielectric 105, but gate voltage effect is spread entirely over the N channel region 103' between the long sides of the gate electrode 106 so that electron current flows. Thus, the ON-resistance is very low. This electrostatic induction transistor does not contain parasitic bipolar transistor or parasitic thyrister. Therefore, no latch-up phenomenon occurs, so that it is hard to destroy.

Figure 13:
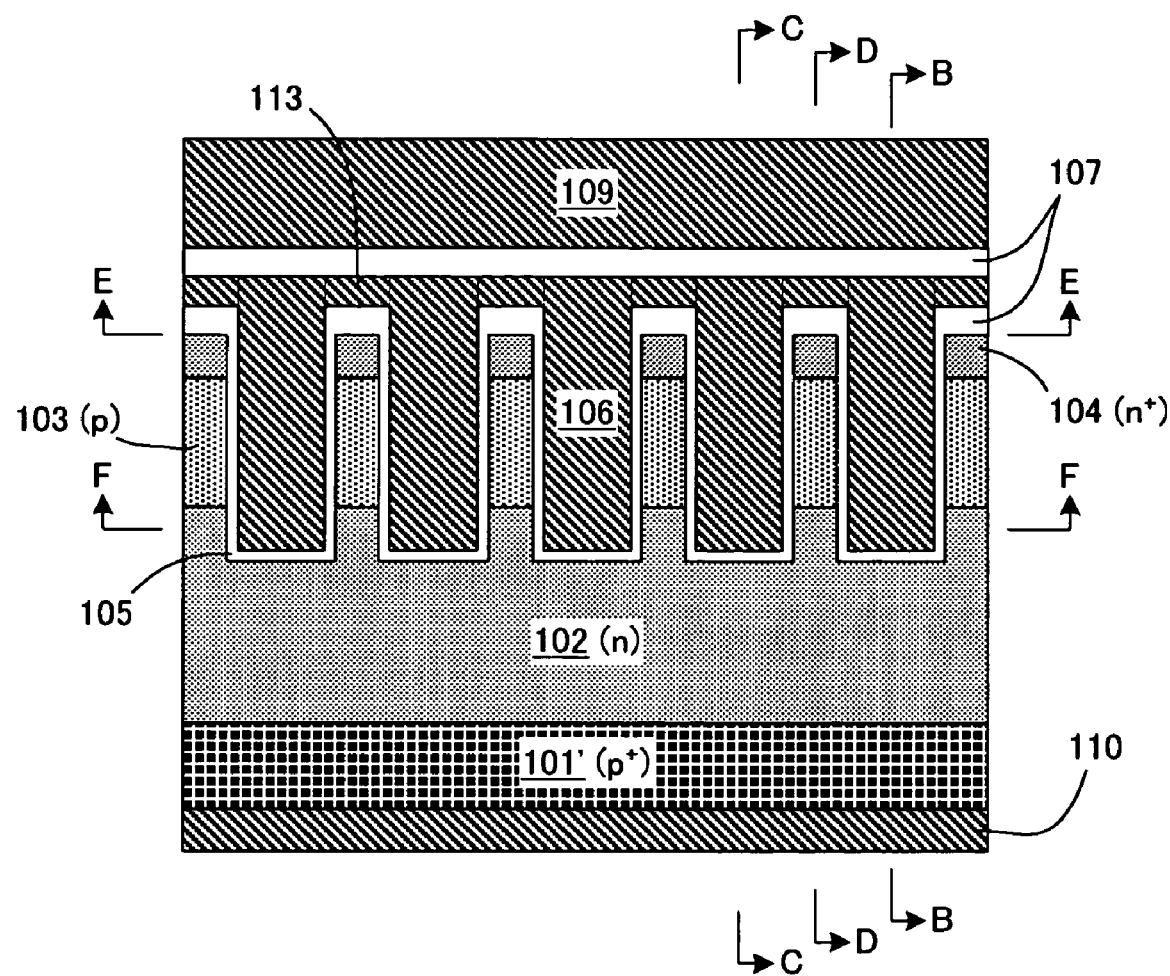
FIG. 13 is an elevation sectional view (portion A—A) of an IGBT of a variant directed to the first embodiment.

Next, an example in which the feature of this embodiment is applied to an insulated gate-type bipolar transistor (IGBT) will be described. This variant is achieved by providing with a P$^+$ collector region 101' instead of the N$^+$ drain region 101. FIG. 13 shows the structure thereof, corresponding to FIG. 3. For FIG. 4 through FIG. 6, the N$^+$ drain regions 101 may be replaced with the P$^+$ collector region 101'. FIG. 1 and FIG. 2 can be used without any change. As for the manufacturing method, a P$^+$ silicon wafer is employed as a starting wafer. Alternatively, the P$^+$ collector region 101' may be formed by introducing P type impurity from the bottom side-or depositing P$^+$ silicon layer on the surface of the bottom side with an N type silicon wafer as a starting wafer.

This IGBT has following advantages. That is, switching time can be adjusted by adjusting a ratio between the effective channel width 111 and the effective P$^+$ source region width 112. This is because the effective channel width 111 affects the quantity of electrons to be injected into the N drift region 102 from the N$^+$ source region 104, while the effective P$^+$ source region width 112 affects the quantity of pull-out of holes from the N drift region 102 to P$^+$ source regions 100. The effective channel width 111 is desired to be 20 μm or less. The reason is that if the effective channel width 111 is too large, the traveling distance of holes which escape from the N drift region 102 to P+ source regions 100 is extended in the vicinity of the center of the long side of gate electrodes.

Second Embodiment

Figure 14:
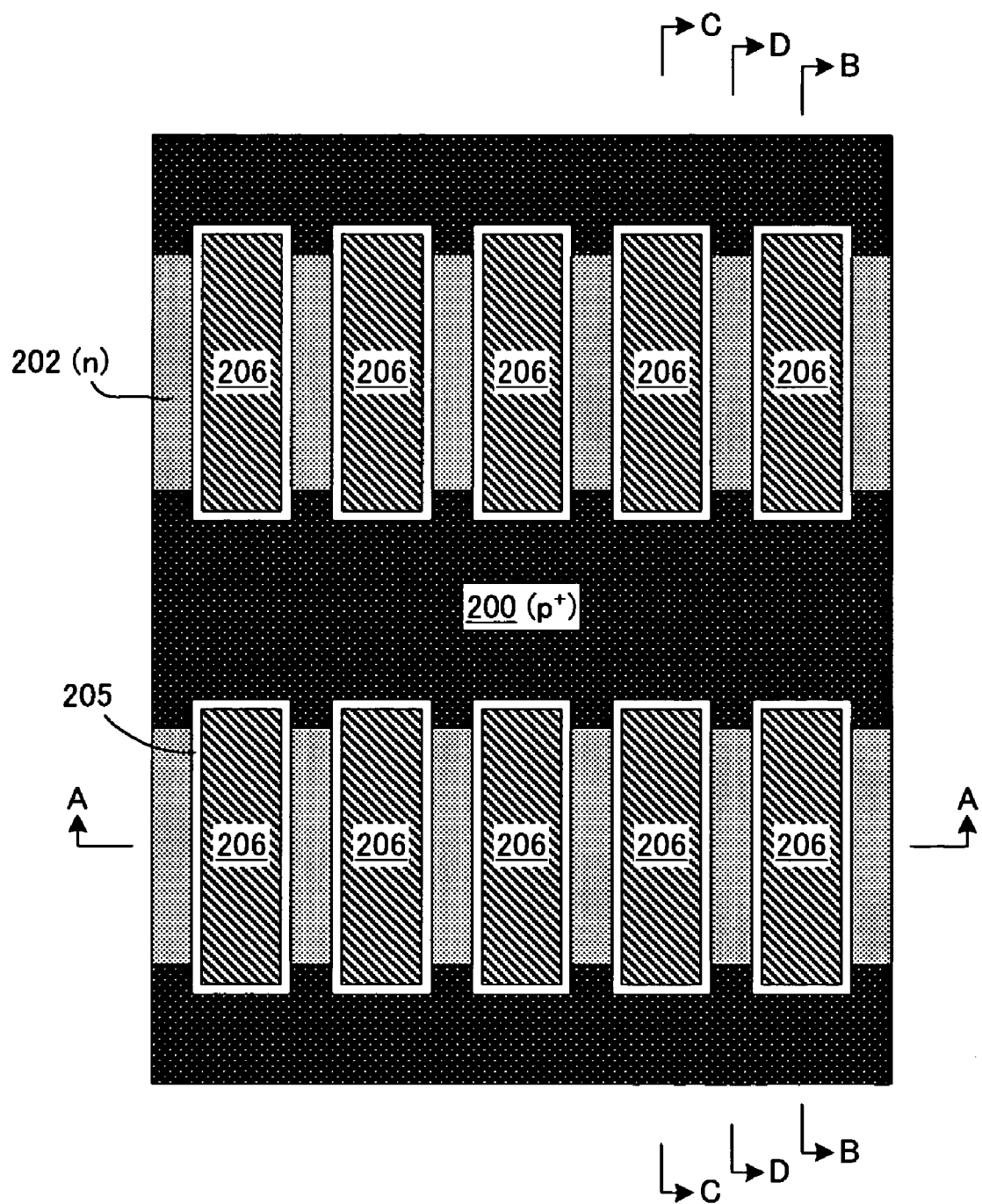
FIG. 14 is a plane sectional view (portion F—F) of structure of a field-effect-type semiconductor device (power MOS) directed to a second embodiment.
Figure 15:
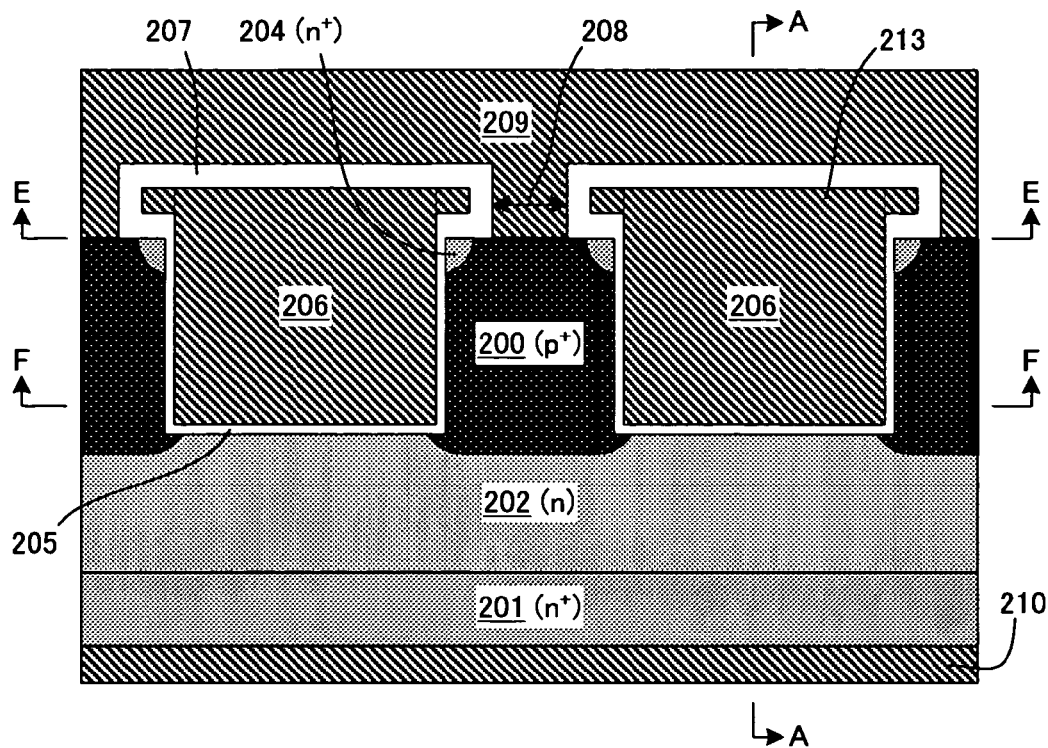
FIG. 15 is an elevation sectional view (portion B—B) of structure of the field-effect-type semiconductor device (power MOS) directed to the second embodiment.
Figure 16:
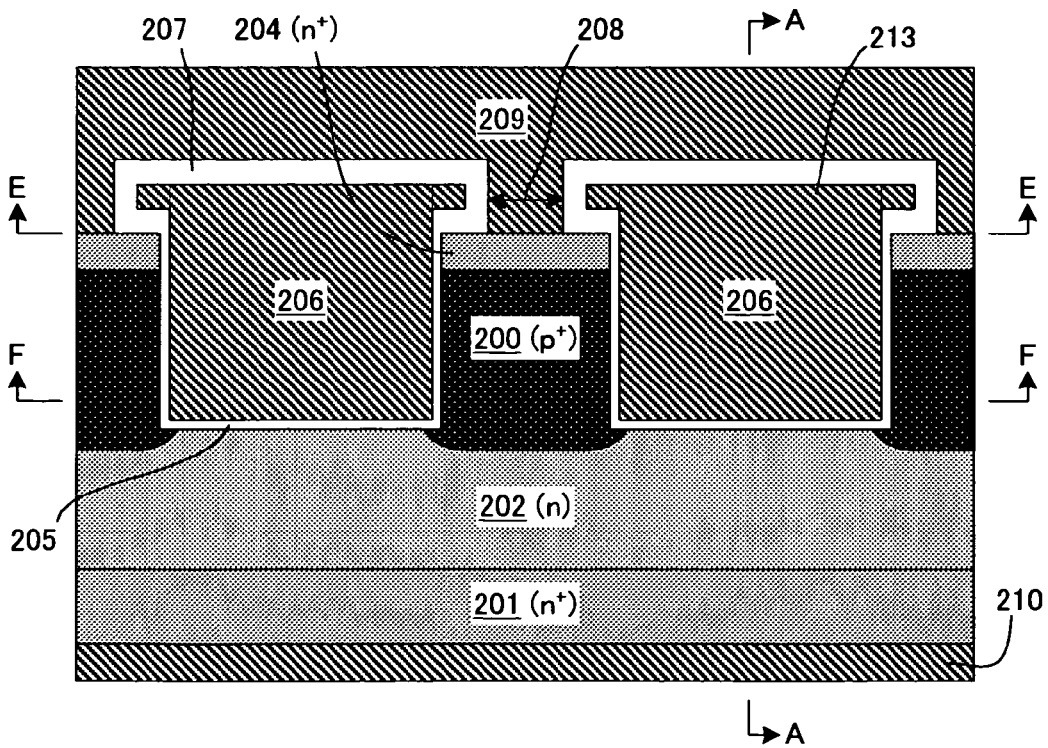
FIG. 16 is an elevation sectional view (portion C—C) of structure of the field-effect-type semiconductor device (power MOS) directed to the second embodiment.
Figure 17:
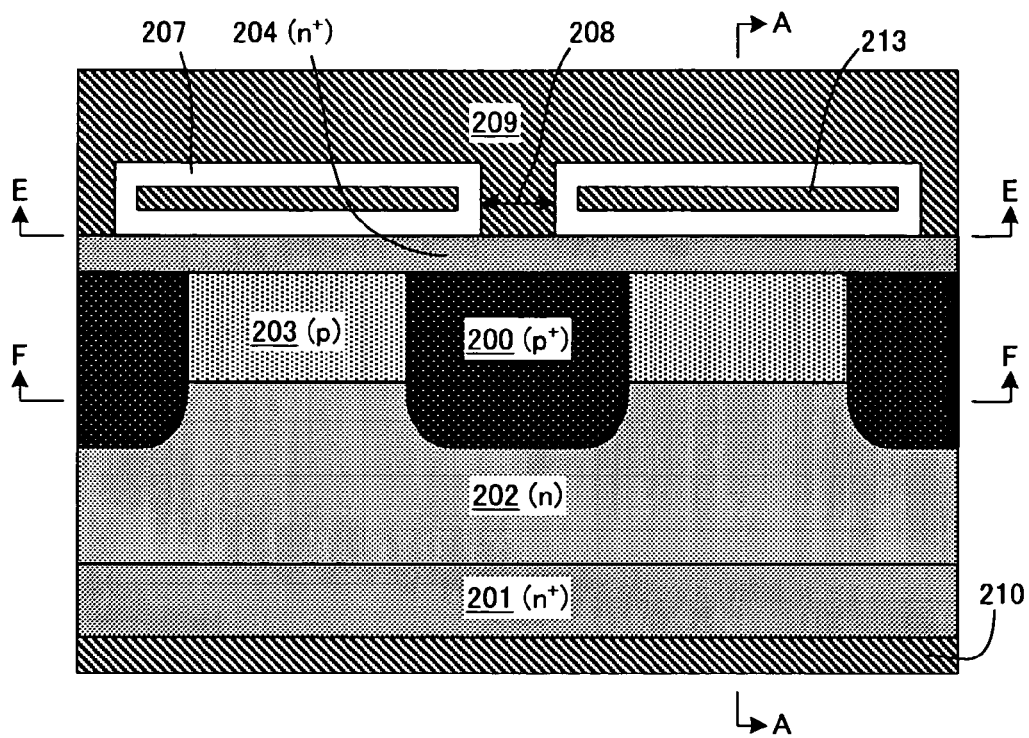
FIG. 17 is an elevation sectional view (portion D—D) of structure of the field-effect-type semiconductor device (power MOS) directed to the second embodiment.

The second embodiment is also an embodiment of the present invention in the form of a field-effect-type semiconductor device having trench type insulated gates. FIG. 14 through FIG. 17 show the structure of the field-effect-type semiconductor device of the second embodiment. FIG. 15 is a sectional view of a portion B—B in FIG. 14 while FIG. 16 is a sectional view of a portion C—C in FIG. 14. FIG. 17 is a sectional view of a portion D—D in FIG. 14. FIG. 14 is a sectional view of a portion F—F in FIG. 15 through FIG. 17. A section of a portion E—E in FIG. 15 through FIG. 17 is the same as FIG. 1 of the first embodiment in which respective reference numerals are changed to "2" instead of "1". A section of the portion A—A in FIG. 14 is the same as FIG. 3 of the first embodiment in which respective reference numerals are changed in the same way. Hereinafter, if FIG. 1 or FIG. 3 is referred to in the description of this embodiment, its reference numerals shall be read as described above.

Common to the first embodiment, this field-effect-type semiconductor device is composed to function as a power MOS. Most thereof is common to the first embodiment in terms of its structure. From viewpoints of the operation, it is common to the first embodiment in that current between the source electrode 209 and the drain electrode 210 is controlled by applying a voltage to gate electrodes 206. Thus, mainly a difference from the first embodiment will be described.

In the field-effect-type semiconductor device of this embodiment, P+ source regions 200 are formed deeper than P+ source regions 100 of the first embodiment. That is, while the bottom end of P+ source regions 100 of the first embodiment is shallower than the bottom end of gate electrodes 106, the bottom of P+ source regions 200 of this embodiment is deeper than the bottom end of gate electrodes 206. For this reason, in the field-effect-type semiconductor device of this embodiment, as shown in FIG. 15, and FIG. 16, shoulder portions of the wall face and bottom face on the short side of gate electrodes 206 are covered with P+ source regions 200.

In the field-effect-type semiconductor device of this embodiment, in addition to the effect of the first embodiment, concentration of electrical field by gate voltage at the shoulder portions of the wall face and bottom face of gate electrodes 206 is relaxed, so that a high voltage-resistance of several kV is achieved. That is, electrical field tends to concentrate at the shoulder portions of gate electrodes 206. Because this portions are covered with P+ source regions 200 different in conduction type from the surrounding, the concentration of electrical field is relaxed.

Figure 18:
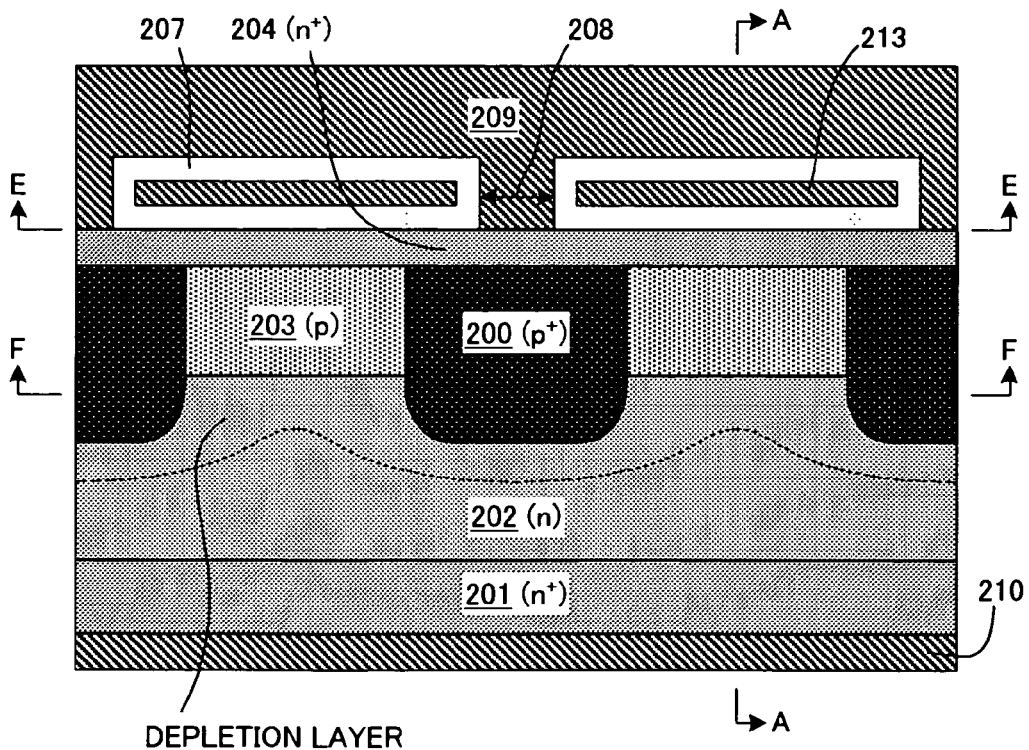
FIG. 18 is an elevation sectional view (portion D—D) showing state of the field-effect-type semiconductor device (power MOS) directed to the second embodiment after switch OFF.

P+ source regions 200 formed deep provide an advantage that the OFF characteristic is excellent. That is, after switch-off operation, a depletion layer is expanded from the bottom end of P+ source regions 200 located at a deep level. For this reason, as indicated with dotted line in FIG. 18, a region depleted in the N drift region 202 is formed in a substantially entire device. As a result, the source electrode 209 and the drain electrode 210 are separated completely. In this way, a field-effect-type semiconductor device having a high voltage-resistance and an excellent OFF characteristic is achieved.

Figure 19:
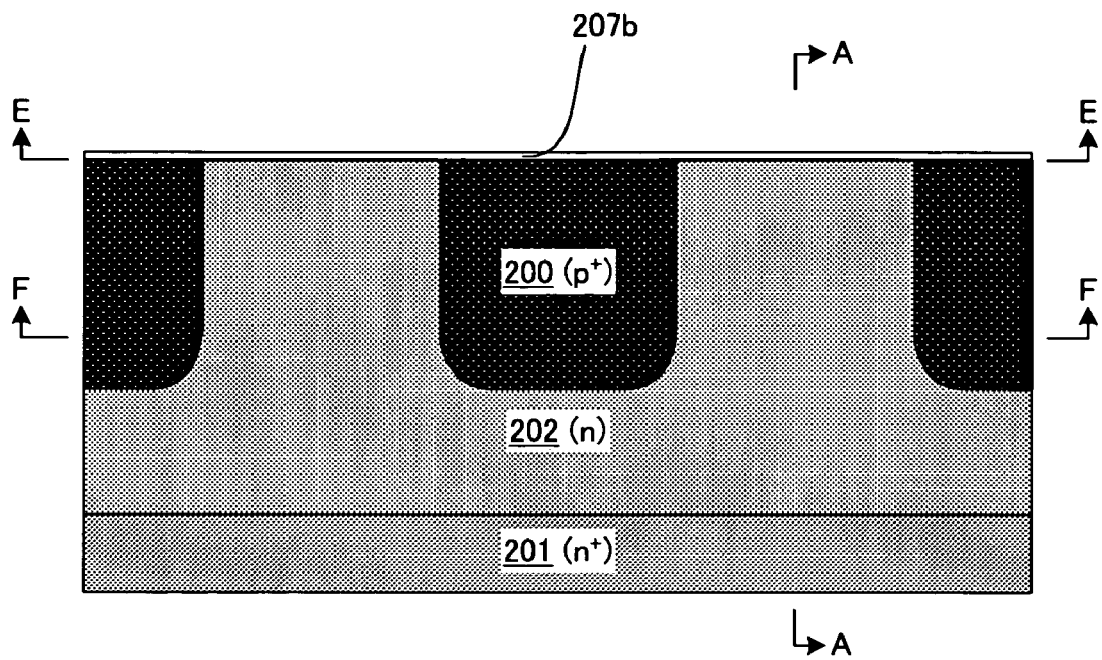
FIG. 19 is an elevation sectional view (1) of the portion B—B showing manufacturing process of the field-effect-type semiconductor device (power MOS) directed to the second embodiment.
Figure 20:
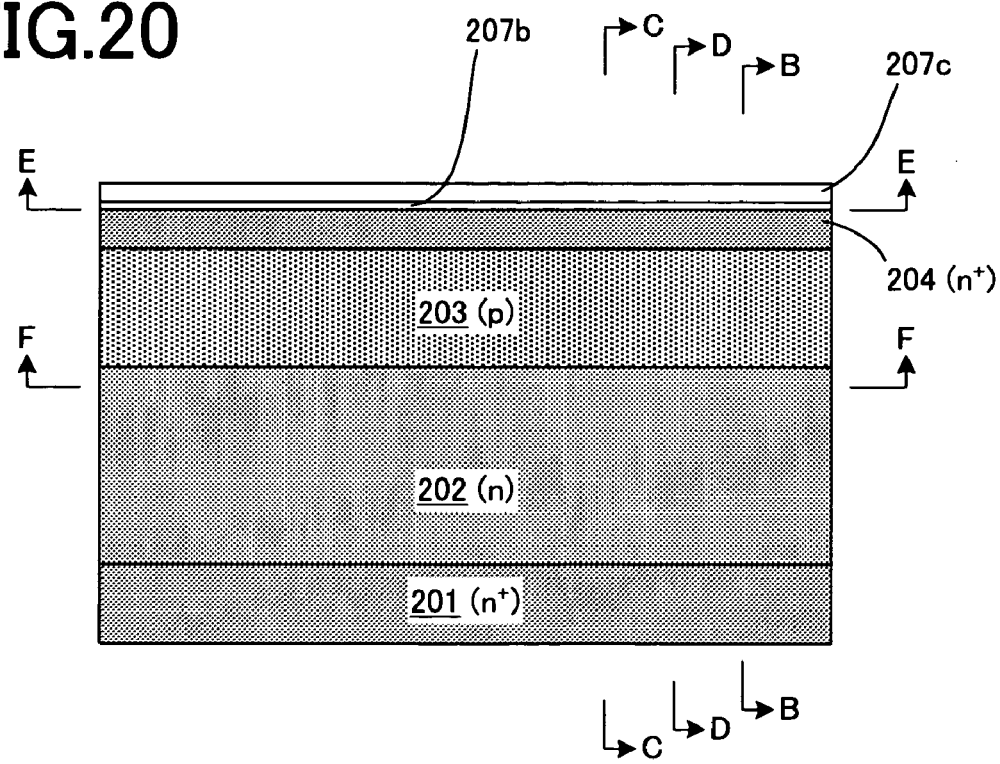
FIG. 20 is an elevation sectional view (2) of the portion A—A showing manufacturing process of the field-effect-type semiconductor device (power MOS) directed to the second embodiment.
Figure 21:
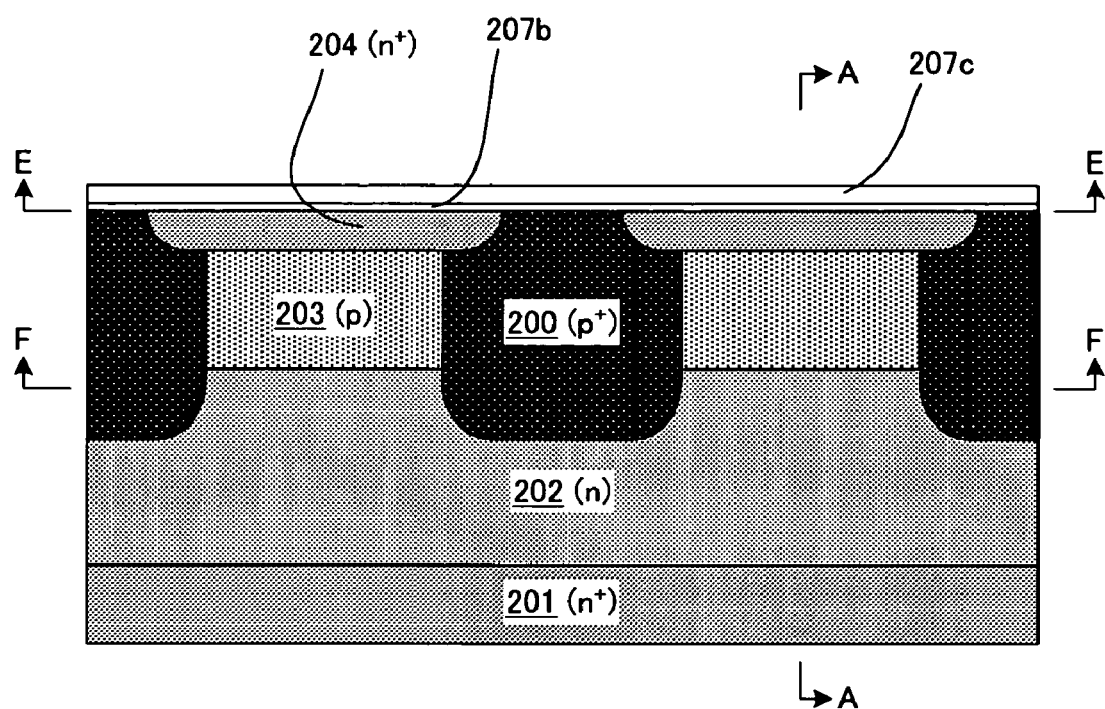
FIG. 21 is an elevation sectional view (2) of the portion B—B showing manufacturing process of the field-effect-type semiconductor device (power MOS) directed to the second embodiment.

Manufacturing process of the field-effect-type semiconductor device of this embodiment will be described with FIG. 19 through FIG. 21. The manufacturing procedure of the field-effect-type semiconductor device of this embodiment is the same as that of the first embodiment up to a step indicated in FIG. 7 (however, reference numerals "1" shall be read as "2"). After that, P+ source regions 200 (including a P+ peripheral region out of the Figure) is formed by ion implantation and heat diffusion. FIG. 19 shows a sectional view in this state (portion B—B, portion C—C, and portion D—D are all the same at this stage). The P channel region 203 and the N+ source region 204 are formed successively by ion implantation and heat diffusion. The ion implantation processes for forming respective regions are carried out through an appropriate pattern mask. Then, oxide film 207c (400 nm thick) is deposited on the oxide film 207b by CVD method. A sectional view in this state is indicated in FIG. 20 (portion A—A) and FIG. 21 (portion B—B). Depth and impurity concentration of each region in this state are 5.0 μm, $15 \times 10^{18}$ cm$^{-3}$ for P+ source regions 200, 2.8 μm, $2.7 \times 10^{17}$ cm$^{-3}$ for the P channel region 203, and 0.8 μm, $1.0 \times 10^{19}$ cm$^{-3}$ for the N+ source region 204. After that, formation of gate electrodes 206, formation of the interlayer dielectric 207, formation of the source electrode 209, and formation of the drain electrode 210 are the same as that of the first embodiment. In this way, the field-effect-type semiconductor device of this embodiment is completed.

If an N channel region is provided instead of the P channel region 203 like the first embodiment, this embodiment can be applied to an electrostatic induction transistor. Further, by providing with a P+ drain region instead of the N+ drain region 201, this embodiment can be applied to an IGBT.

Third Embodiment

Figure 22:
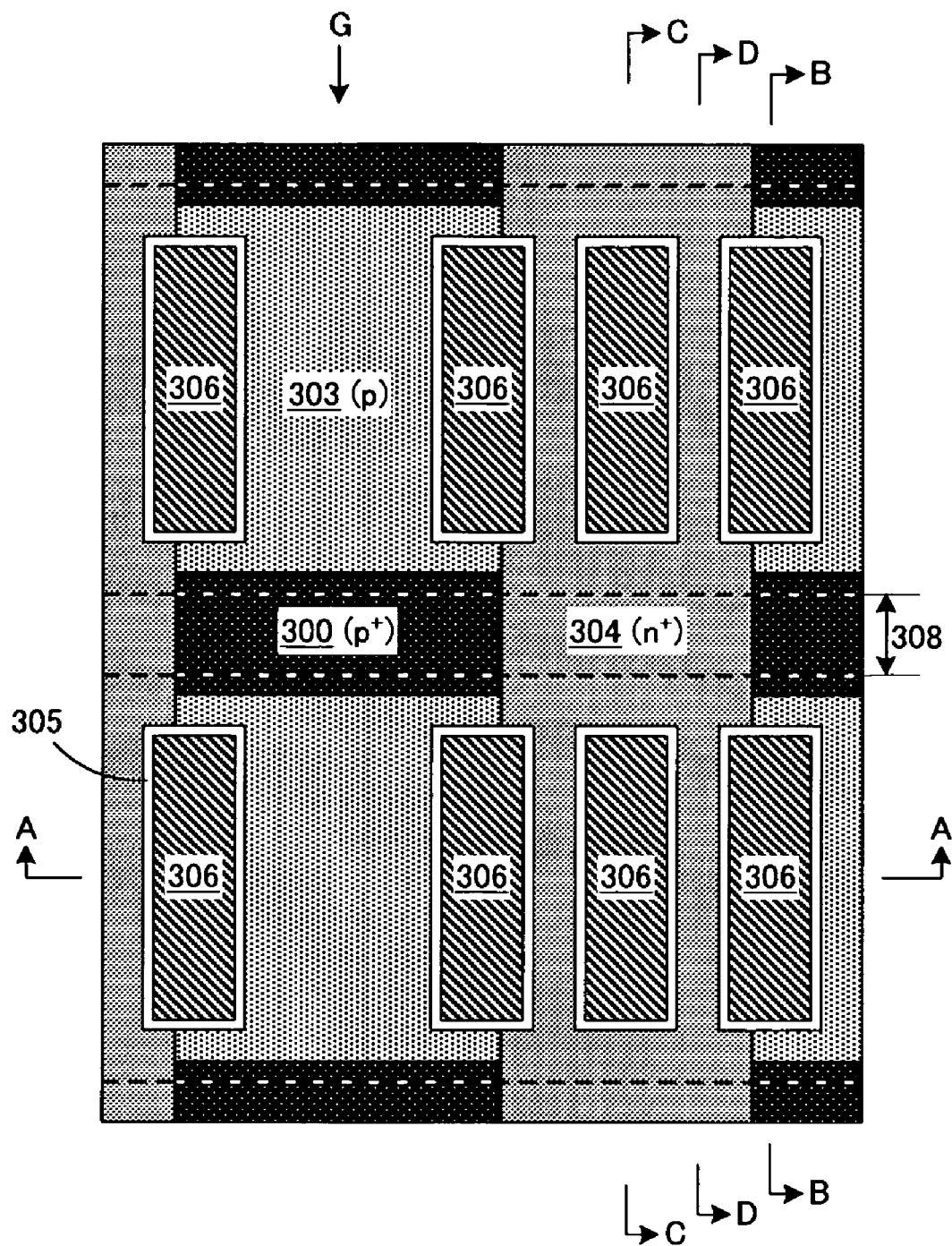
FIG. 22 is a plane sectional view (portion E—E) of structure of a field-effect-type semiconductor device (power MOS) directed to a third embodiment.
Figure 23:
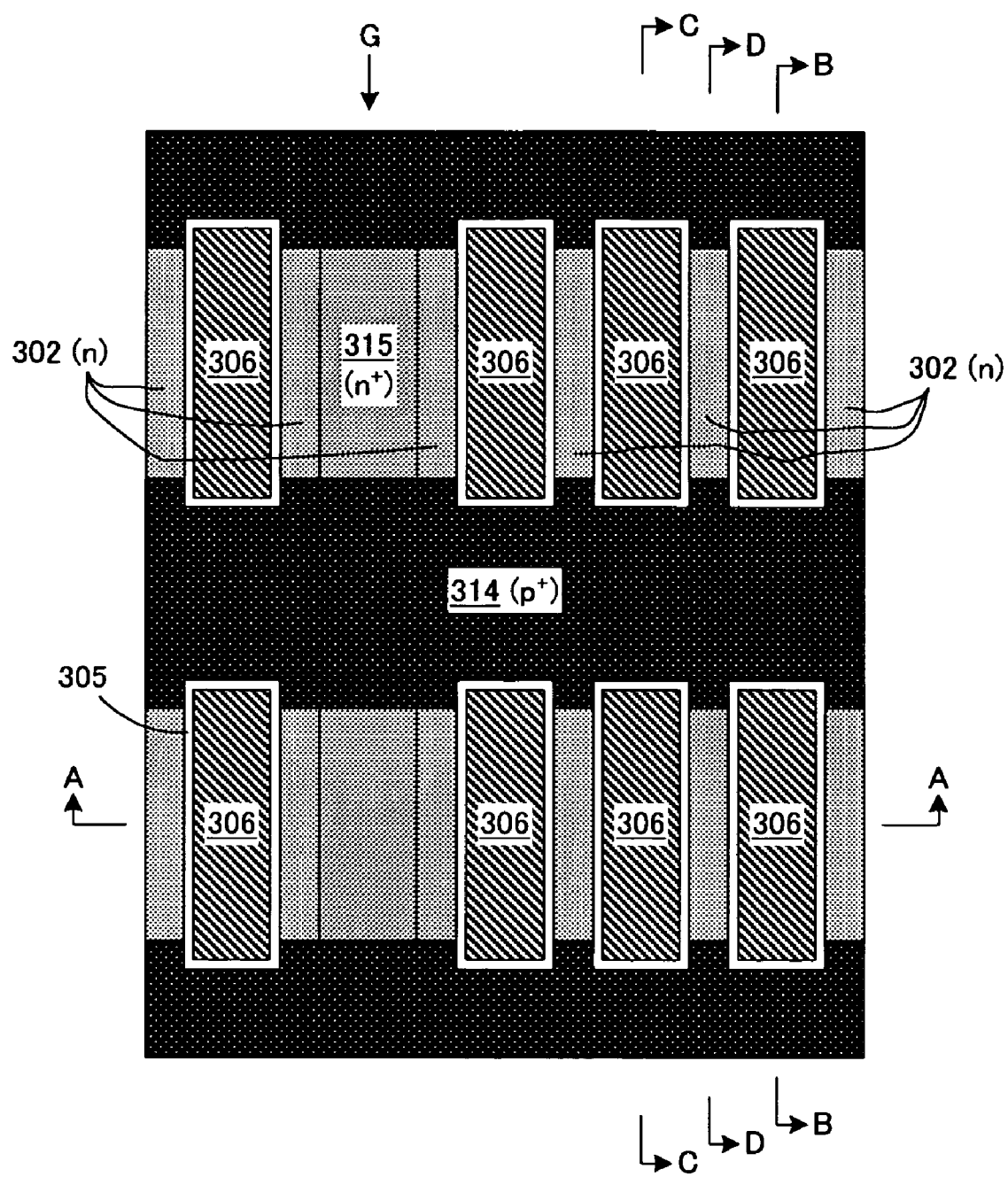
FIG. 23 is a plane sectional view (portion F—F) of structure of the field-effect-type semiconductor device (power MOS) directed to the third embodiment.
Figure 24:
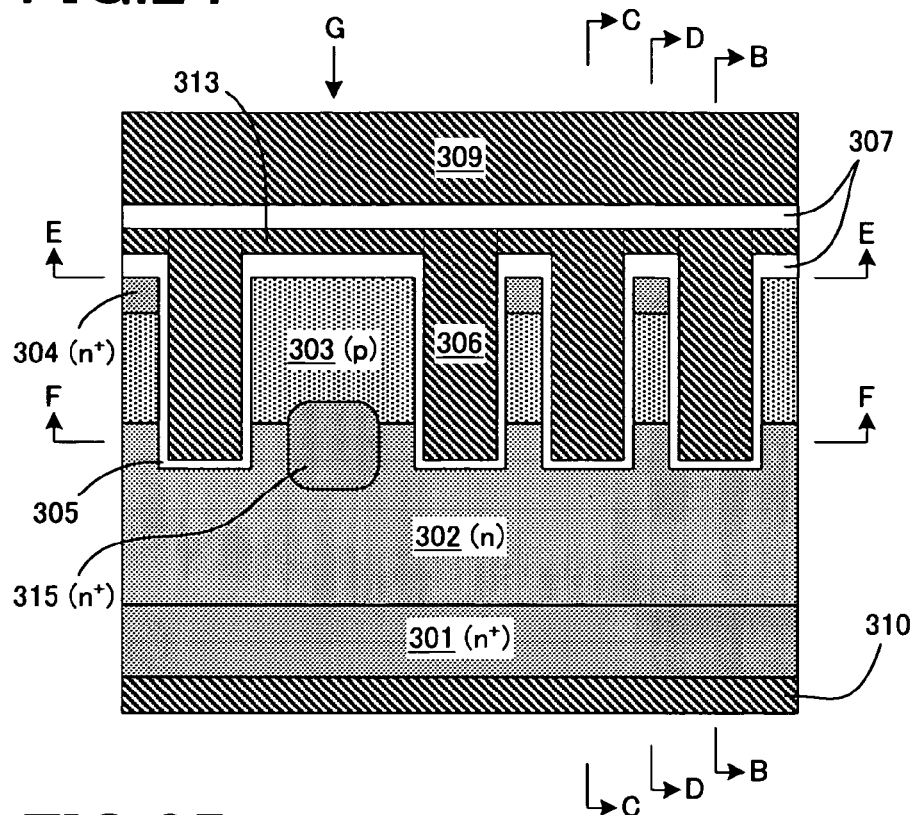
FIG. 24 is an elevation sectional view (portion A—A) of structure of the field-effect-type semiconductor device (power MOS) directed to the third embodiment.
Figure 25:
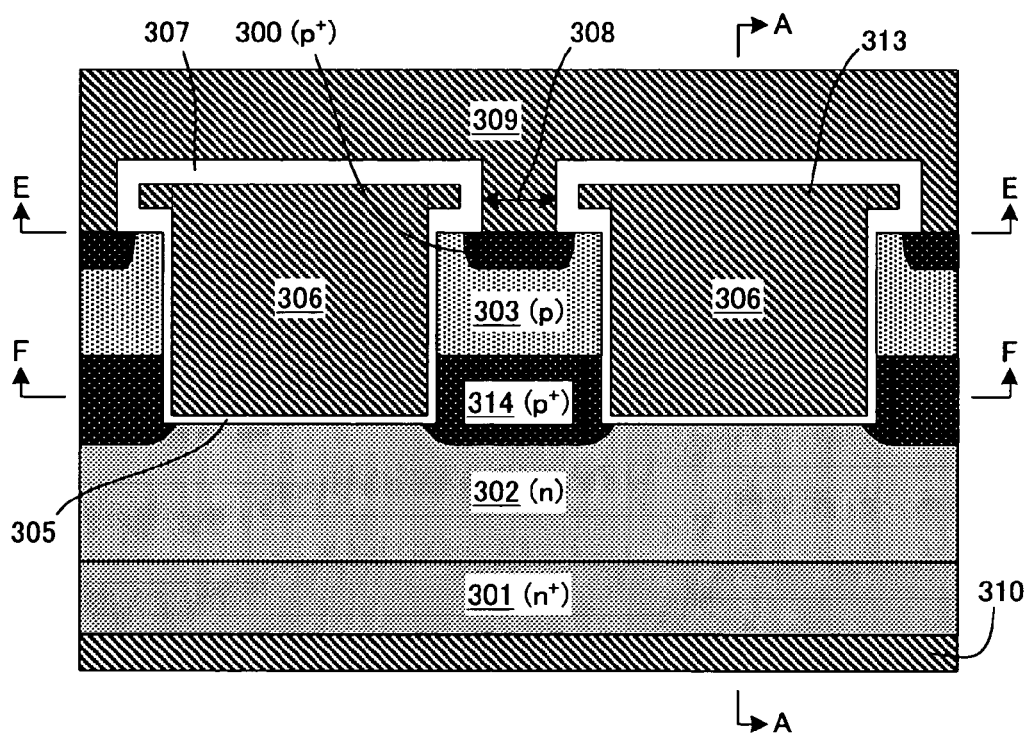
FIG. 25 is an elevation sectional view (portion B—B) of structure of the field-effect-type semiconductor device (power MOS) directed to the third embodiment.
Figure 26:
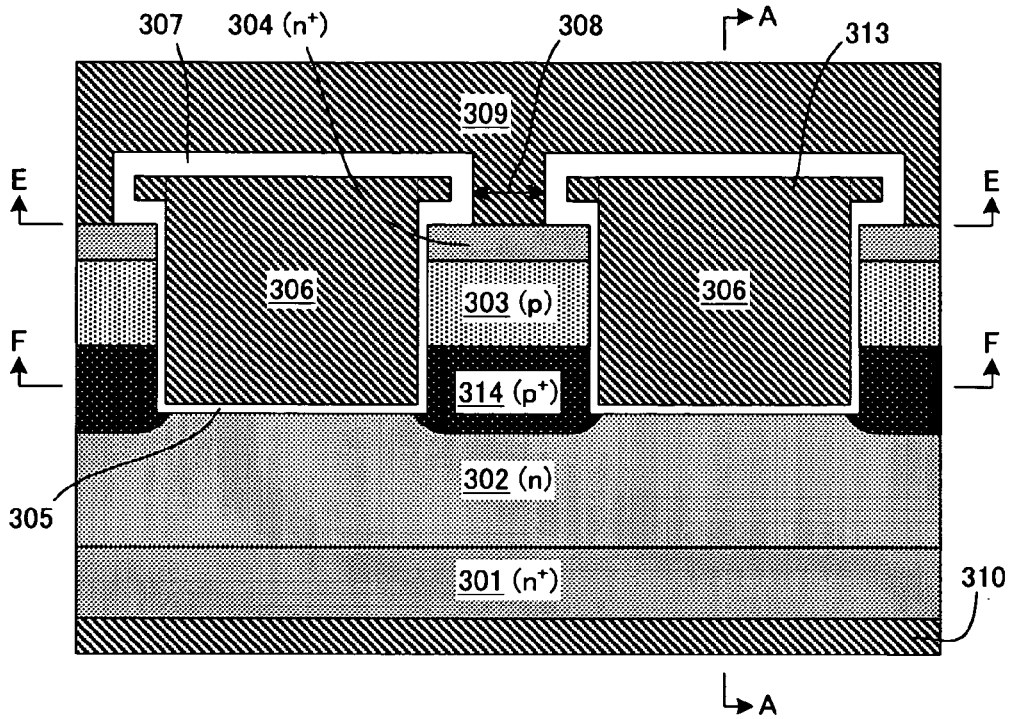
FIG. 26 is an elevation sectional view (portion C—C) of structure of the field-effect-type semiconductor device (power MOS) directed to the third embodiment.
Figure 27:
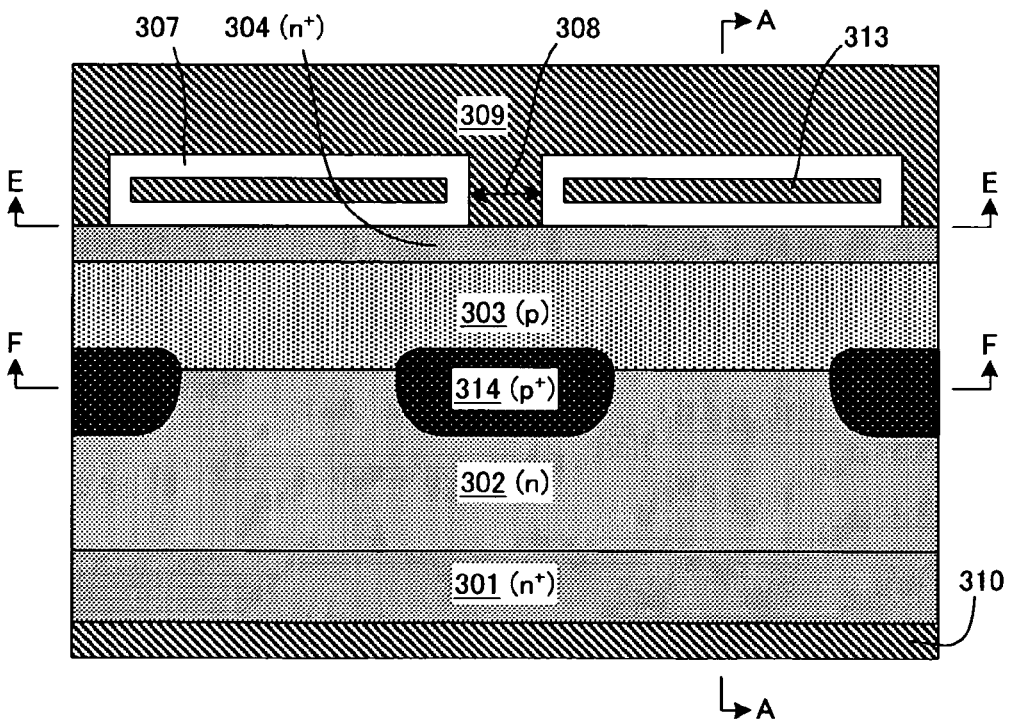
FIG. 27 is an elevation sectional view (portion D—D) of structure of the field-effect-type semiconductor device (power MOS) directed to the third embodiment.

The third embodiment is also an embodiment of the present invention in the form of a field-effect-type semiconductor device having trench type insulated gates. FIG. 22 through FIG. 27 show the structure of the field-effect-type semiconductor device of the third embodiment. FIG. 24 is a sectional view of a portion A—A in FIG. 22 and FIG. 23. FIG. 25 is a sectional view of a portion B—B in FIG. 22 and FIG. 23. FIG. 26 is a sectional view of a portion C—C in FIG. 22 and FIG. 23. FIG. 27 is a sectional view of a portion D—D in FIG. 22 and FIG. 23. FIG. 22 is a sectional view of a portion E—E in FIG. 24 through FIG. 27. FIG. 23 is a sectional view of a portion F—F in FIG. 24 through FIG. 27.

Common to the first and second embodiments, this field-effect-type semiconductor device is constructed to function as a power MOS. This embodiment has a common portion to the first and second embodiments in terms of its structure. Further, this embodiment is common to the first and second embodiments in terms of the operation in that current between a source electrode 309 and a drain electrode 310 is controlled by applying a voltage to gate electrodes 306. Thus, mainly, differences from the first and second embodiments will be described.

In the field-effect-type semiconductor device of this embodiment, gate electrodes 306 are thinned out at some places in the right and left direction in FIG. 22 through FIG. 24 (a position indicated with an arrow G). N+ source regions 304 are formed only at places in which gate electrodes 306 are not thinned out. P+ source regions 300 are formed in a belt-like shape between N+ source regions 304 along contact openings 308. A remaining area of the surface of the semiconductor substrate is occupied by a P channel region 303. Bottom of P⁺ source regions 300 is shallower than that of gate electrodes 306 as shown in FIG. 25.

As shown in FIG. 23 through FIG. 27, P⁺ embedded regions 314 and N⁺ embedded regions 315 are formed below the P channel region 303. P⁺ embedded regions 314 are formed at positions below P⁺ source regions 300 in FIG. 22. Width of P⁺ embedded regions 314 is larger than width of P⁺ source regions 300. So, P⁺ embedded regions 314 oppose part of wall face and bottom face of gate electrodes 306. Top level of P⁺ embedded regions 314 (that is, bottom level of the P channel region 303) is shallower than bottom face of gate electrodes 306 while its bottom level is deeper than bottom face of gate electrodes 306. As shown in FIG. 25, shoulder portions of the wall face and bottom face on the short side of gate electrodes 306 are covered with P⁺ embedded regions 314. N⁺ embedded regions 315 are formed between P⁺ embedded regions 314 at a place in which gate electrodes 306 are thinned out. N⁺ embedded regions 315 are formed at the same depth as P⁺ embedded regions 314. Then, the P channel region 303 and the N drift region 302 are in a direct contact with each other at places in which neither P⁺ embedded region 314 nor N⁺ embedded region 315 is not formed.

The structure on the side of the bottom surface of the field-effect-type semiconductor device of this embodiment (N⁺ drain region 301, drain electrode 310) is the same as that of the first and second embodiments.

In the field-effect-type semiconductor device of this embodiment, voltage-resistance of gate dielectric 305 is high like the second embodiment in addition to the effect of the first embodiment. This is because concentration of electrical field due to gate voltage in shoulder portions of the wall face and bottom face of gate electrodes 306 is relaxed by P⁺ embedded regions 314. Further, this embodiment is the same as the second embodiment in that its OFF characteristic is excellent. Because depletion layer is expanded from P⁺ embedded regions 314 located at deep level after switch-off, the source electrode 309 and the drain electrode 310 are separated completely.

The field-effect-type semiconductor device of this embodiment has an advantage that effective channel width opposing the wall face on the long side of gate electrodes 306 is larger than the second embodiment. That is, effective channels in which ON current actually flows are faces opposing the wall faces on the long side of gate electrodes 306 in the P channel region 303. However, of the opposing face on the long side of the gate electrode 306, portions occupied with P⁺ region do not turn to effective channels. In the field-effect-type semiconductor device of this embodiment, area occupied with P⁺ region (P⁺ source region 300 and P⁺ embedded region 314) of the opposing face on the long side of gate electrodes 306 is smaller than that of the second embodiment. The reason exists in that depth of P⁺ source regions 300 is kept small by providing with P⁺ embedded regions 314 at deep level. Of course, thickness of P⁺ embedded regions 314 (difference in level between top end and bottom end) is not so large, also. Further, lateral expansion of these regions is also small. Thus, in the field-effect-type semiconductor device of this embodiment, its effective channel width is larger than that of the second embodiment in which a quite large portion of the wall face on the long side of gate electrodes 206 is covered with P⁺ source regions 200 which reach deeper than gate electrodes 206 from the surface level. Thus, its ON-resistance and ON voltage are much lower.

The field-effect-type semiconductor device of this embodiment has a following advantage because N⁺ embedded regions 315 are provided at deep level. That is, in case the bottom surface is of P⁺ type drain region, ON voltage can be reduced because holes are collected at N⁺ embedded regions 315.

Figure 28:
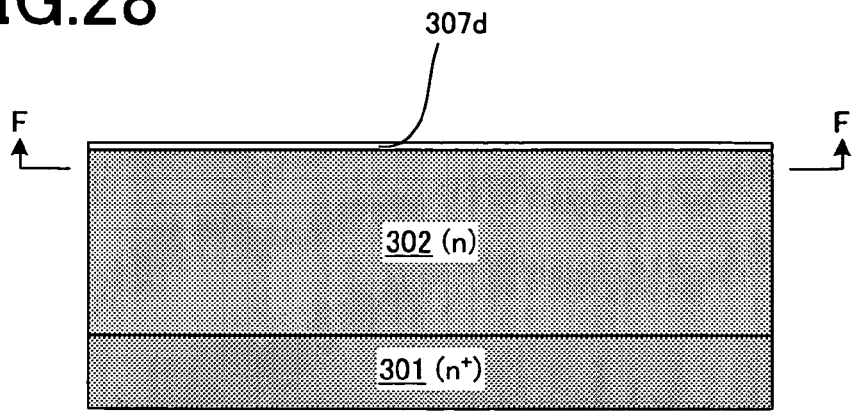
FIG. 28 is an elevation sectional view (1) showing manufacturing process of the field-effect-type semiconductor device (power MOS) directed to the third embodiment.
Figure 29:
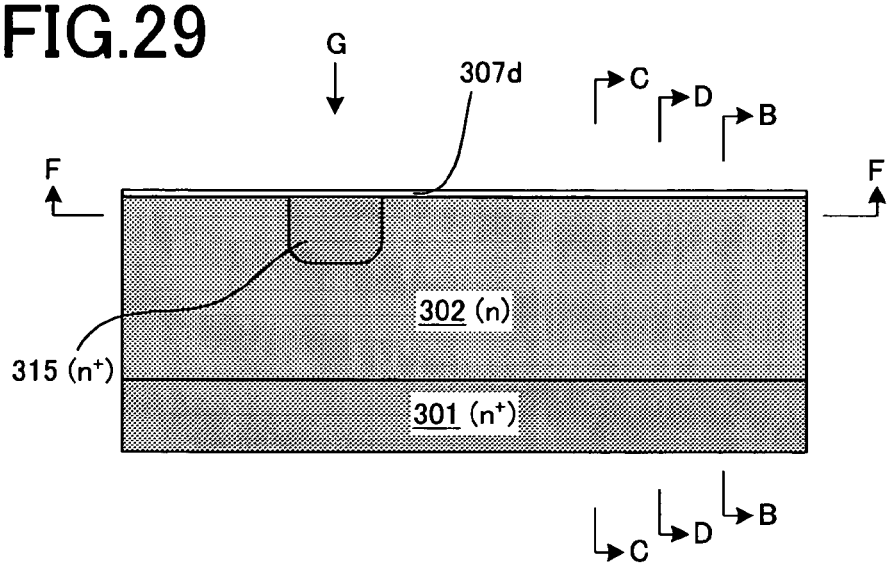
FIG. 29 is an elevation sectional view (2) of the portion A—A showing manufacturing process of the field-effect-type semiconductor device (power MOS) directed to the third embodiment.
Figure 30:
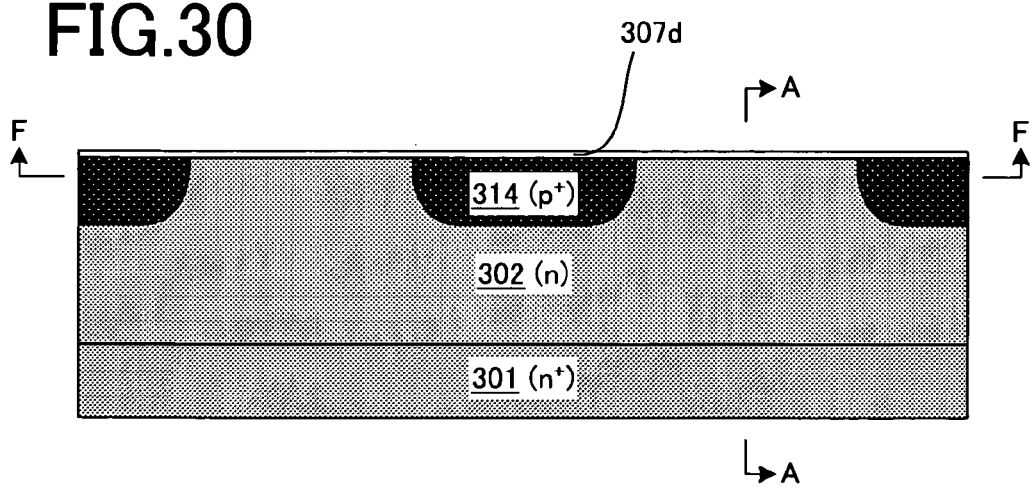
FIG. 30 is an elevation sectional view (2) of the portion B—B showing manufacturing process of the field-effect-type semiconductor device (power MOS) directed to the third embodiment.

Manufacturing process of the field-effect-type semiconductor device of this embodiment will be described with reference to FIG. 28 through FIG. 32. First, a state having the N⁺ drain region 301, the N drift region 302 and the thermal oxide film 307d is obtained in the same procedure as up to the step indicated by FIG. 7 in the first and second embodiments. FIG. 28 shows a sectional view of this state in the third embodiment. After that, P⁺ embedded regions 314 and N⁺ embedded regions 315 are formed successively by ion implantation and heat diffusion. For formation of each region, ion implantation is carried out through an appropriate pattern mask. Sectional views of this state are indicated by FIG. 29 (portion A—A) and FIG. 30 (those of portion B—B, portion C—C, and portion D—D are the same at this stage).

Figure 31:
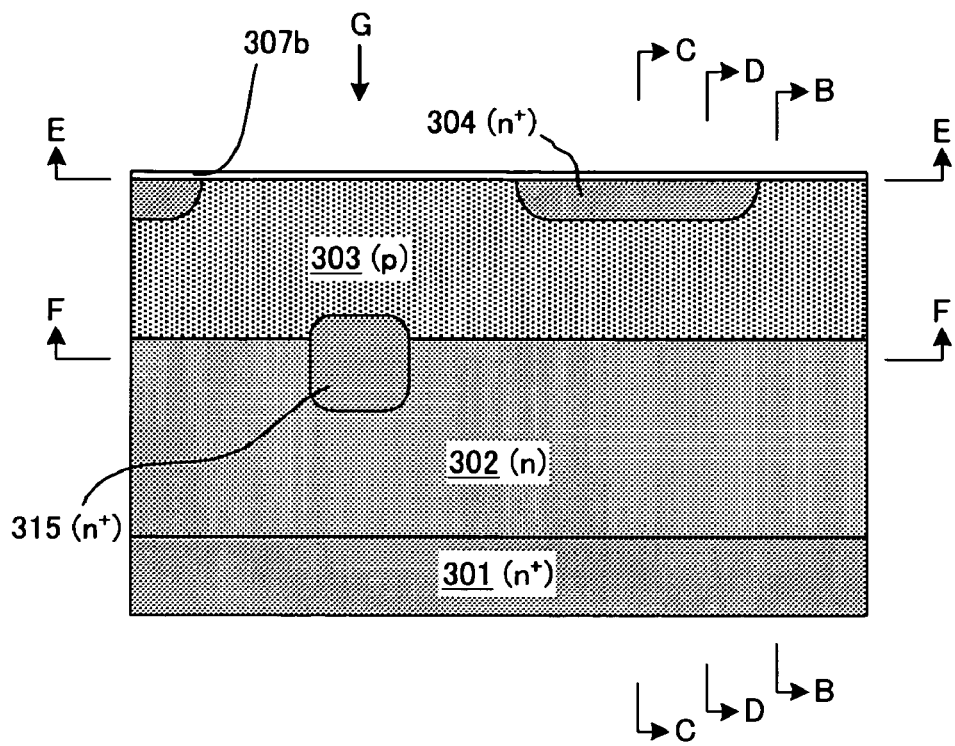
FIG. 31 is an elevation sectional view (3) of the portion A—A showing manufacturing process of the field-effect-type semiconductor device (power MOS) directed to the third embodiment.
Figure 32:
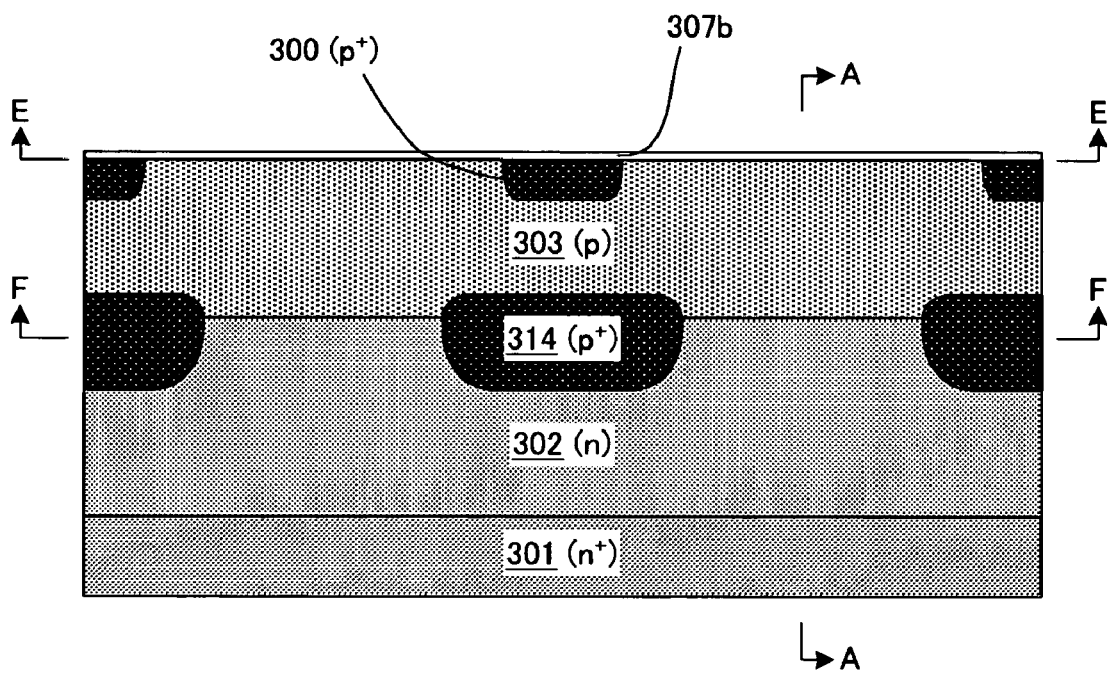
FIG. 32 is an elevation sectional view (3) of the portion B—B showing manufacturing process of the field-effect-type semiconductor device (power MOS) directed to the third embodiment.

After the oxide film 307d is removed, P type silicon layer is formed by epitaxial growth. This P type silicon layer turns to the P channel region 303. Then, after a thermal oxide film 307b is formed on its surface, P⁺ source regions 300 and the N⁺ source region 304 are formed successively by ion implantation and heat diffusion. The ion implantations for formation of these regions are carried out through an appropriate pattern mask. Sectional views of this state are indicated by FIG. 31 (portion A—A) and FIG. 32 (portion B—B). Formation of gate electrodes 306, formation of interlayer dielectric 307, formation of the source electrode 309 and formation of the drain electrode 310 are the same as the first embodiment. In this way, the field-effect-type semiconductor device of this embodiment is completed.

This embodiment can be applied to an electrostatic induction transistor by providing with an N channel region instead of the P channel region 303 like the first and second embodiments. Further, this embodiment can be applied to an IGBT by providing with a P⁺ drain region instead of the N⁺ drain region 301.

Fourth Embodiment

Figure 33:
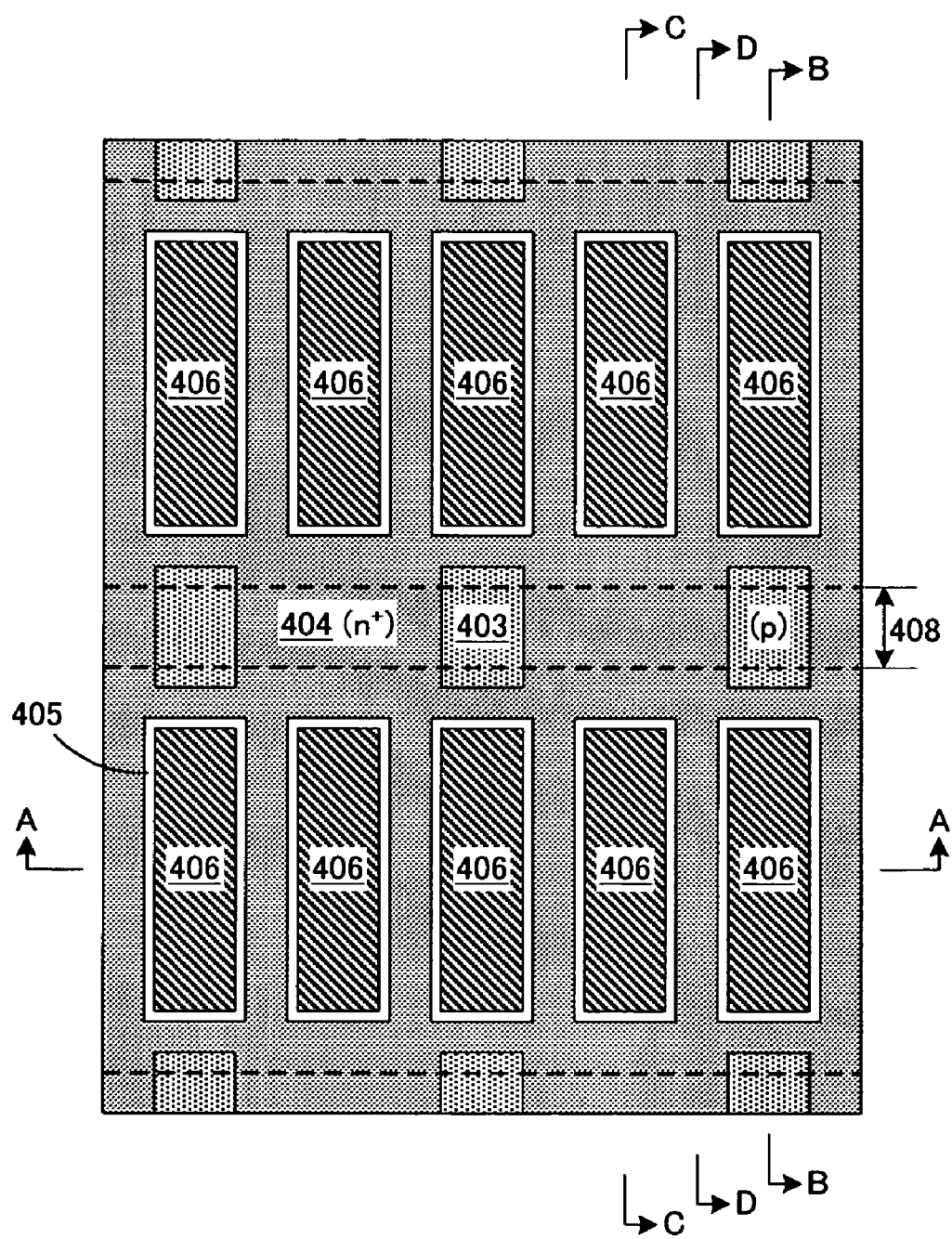
FIG. 33 is a plane sectional view (portion E—E) of structure of a field-effect-type semiconductor device (power MOS) directed to a fourth embodiment.
Figure 34:
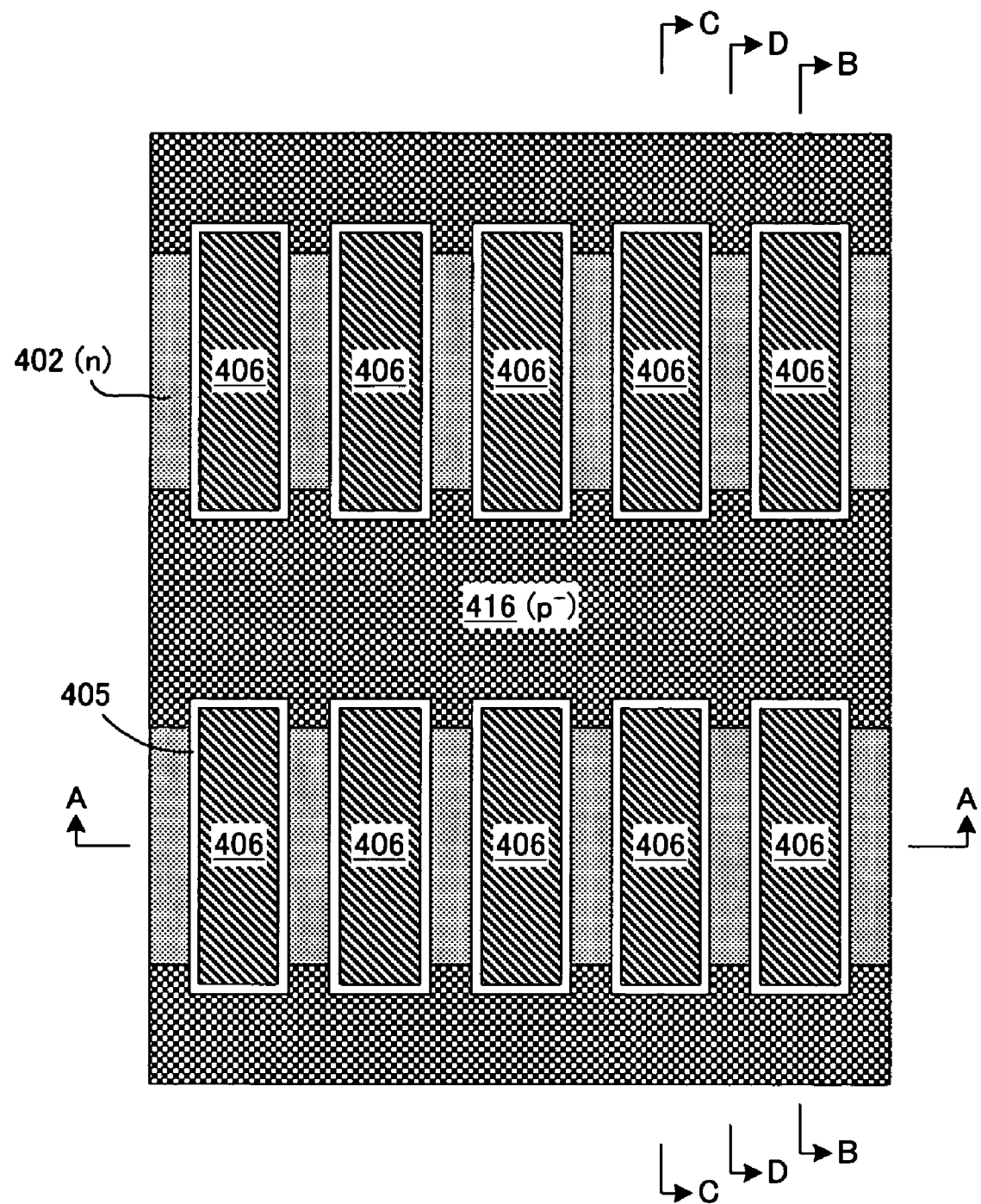
FIG. 34 is a plane sectional view (portion F—F) of structure of the field-effect-type semiconductor device (power MOS) directed to the fourth embodiment.
Figure 35:
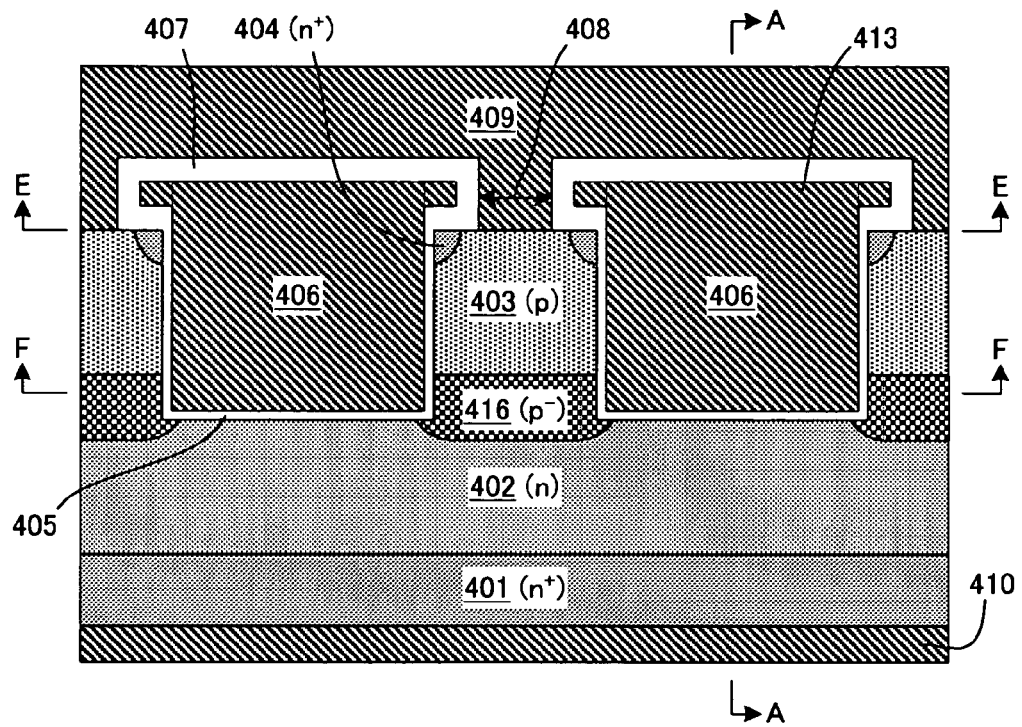
FIG. 35 is an elevation sectional view (portion B—B) of structure of the field-effect-type semiconductor device (power MOS) directed to the fourth embodiment.
Figure 36:
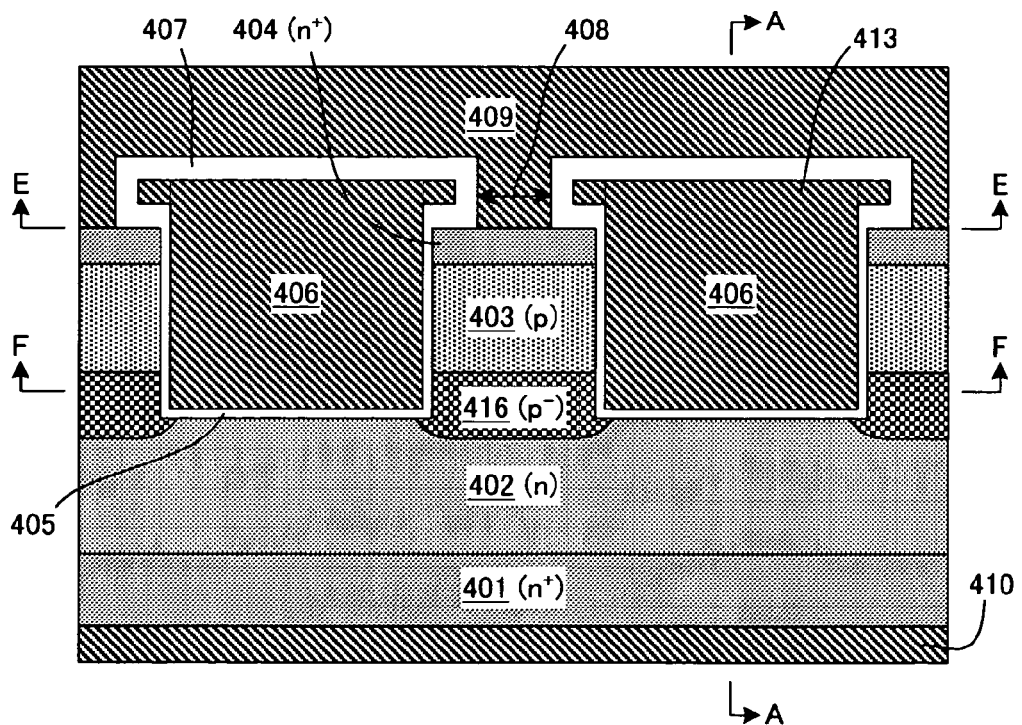
FIG. 36 is an elevation sectional view (portion C—C) of structure of the field-effect-type semiconductor device (power MOS) directed to the fourth embodiment.
Figure 37:
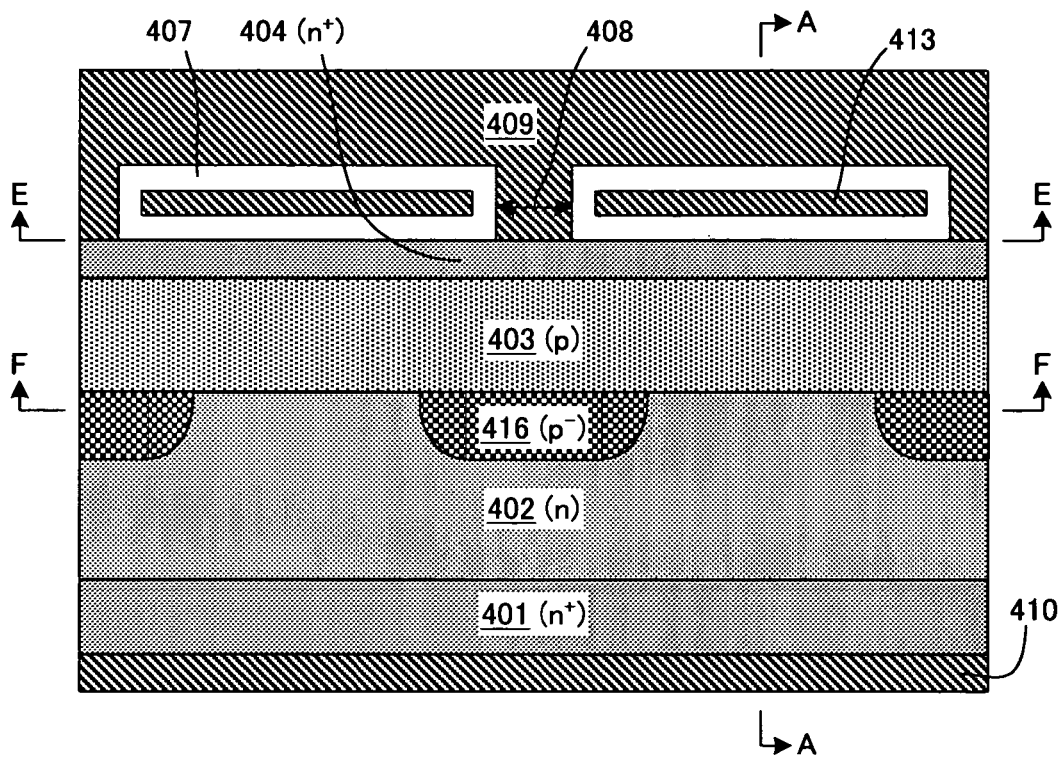
FIG. 37 is an elevation sectional view (portion D—D) of structure of the field-effect-type semiconductor device (power MOS) directed to the fourth embodiment.

The fourth embodiment is an embodiment of the present invention also in the form of a field-effect-type semiconductor device having trench-type insulated gates. FIG. 33 through FIG. 37 show the structure of the field-effect-type semiconductor device of the fourth embodiment. FIG. 35 is a sectional view of a portion B—B in FIG. 33 and FIG. 34. FIG. 36 is a sectional view of a portion C—C in FIG. 33 and FIG. 34. FIG. 37 is a sectional view of a portion D—D in FIG. 33 and FIG. 34. FIG. 33 is a sectional view of a portion E—E in FIG. 35 through FIG. 37. FIG. 34 is a sectional view of a portion F—F in FIG. 35 through FIG. 37. A section of a portion A—A in FIG. 33 and FIG. 34 is the same as FIG. 3 of the first embodiment in which respective reference numerals are changed to "4" instead of "1". If FIG. 3 is referred to in a following description of this embodiment, the reference numerals shall be read in this way.

Common to the first through the third embodiments, this field-effect-type semiconductor device is constructed to function as a power MOS. This has a common portion to any of the first to third embodiments in terms of its structure. Further, this embodiment is common to the first to third embodiments in terms of the operation in that current between a source electrode 409 and a drain electrode 410 is controlled by applying voltage to gate electrodes 406. Thus, mainly, differences from the first to third embodiments will be described.

In the field-effect-type semiconductor device of this embodiment, a P channel region 403 and an N⁺ source regions 404 as well as trench-structured gate electrodes 106 are provided on the surface side of the semiconductor substrate. The bottom end of the P channel region 403 is deeper than the bottom end of the N⁺ source region 404. P⁻ source regions 416 and an N drift region 402 are provided further below the P channel region 403. P⁻ source regions 416 are formed in embedded type along positions in which contact openings 408 are formed on the surface level of FIG. 33. Then, width of P⁻ source regions 416 is as large as to overlap gate electrodes 406 on both sides vertically in FIG. 34. Thus, shoulder portions of the wall face and bottom face on the short side of gate electrodes 406 are covered with P⁻ source regions 416 as shown in FIG. 35 and FIG. 36. Then, the P channel region 403 and the N drift region 402 are in a direct contact with each other at places in which no P⁻ source region 416 is formed.

As shown in FIG. 33, there provided areas wherein the P channel region 403 occupies the surface of the semiconductor substrate at every other position between short sides of gate electrodes 406. A remaining portion of the surface of the semiconductor substrate is occupied by the N⁺ source region 404. As shown in FIG. 33 and FIG. 35 through FIG. 37, contact openings 408 in which the source electrode 409 is in contact with the P channel region 403 and the N⁺ source region 404 are provided between short sides of gate electrodes 406. Contact openings 408 are formed in a belt-like shape parallel to the short side of gate electrodes 406.

In the field-effect-type semiconductor device of this embodiment, voltage-resistance of gate dielectric 405 is high like the second and third embodiments in addition to the effect of the first embodiment. This is because concentration of electric field due to gate voltage at shoulder portions of the wall face and bottom face of gate electrodes 406 is relaxed by P⁻ source regions 416 embedded at deep level. This embodiment is the same as the second and third embodiments in that its OFF characteristic is excellent. This is because depletion layer is expanded from P⁻ source regions 416 located at deep level after switch off, so that the source electrode 409 and the drain electrode 410 are separated from each other completely.

Further, the field-effect-type semiconductor device of this embodiment has an advantage that its effective channel width on the wall face on the long side of gate electrodes 406 is larger than that of the second embodiment like the third embodiment. The effective channel width of this embodiment is still larger than that of the third embodiment. This is because an action of narrowing effective channel of P⁻ source regions 416 having a low acceptor concentration is small. Thus, its ON resistance and ON voltage are still lower.

Figure 38:
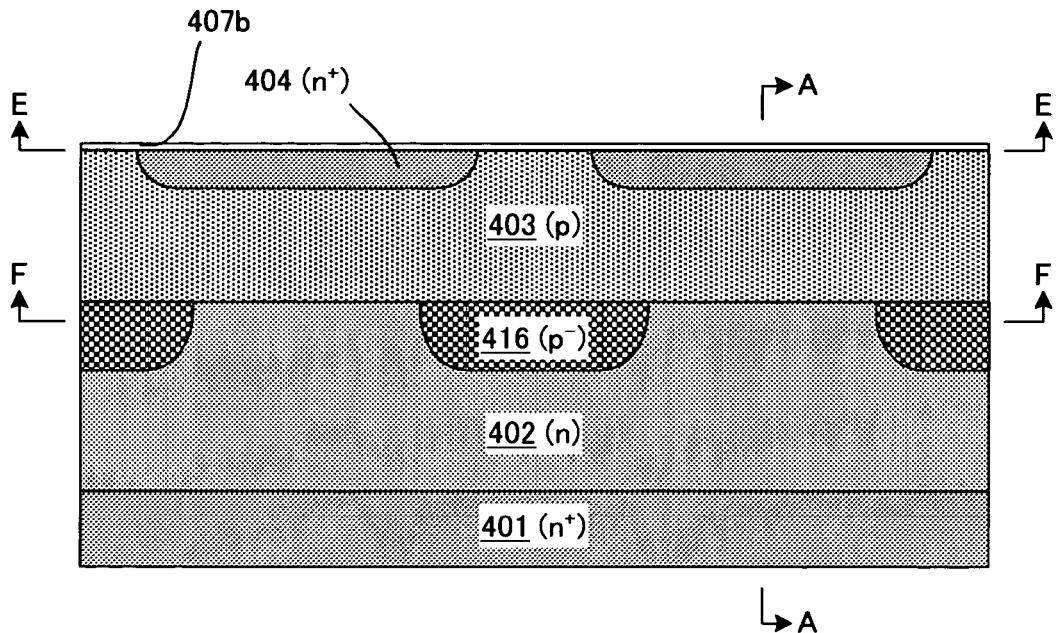
FIG. 38 is an elevation sectional view (portion B—B) showing manufacturing process of the field-effect-type semiconductor device (power MOS) directed to the third embodiment.

Manufacturing process of the field-effect-type semiconductor device of this embodiment will be described with reference to FIG. 38. The manufacturing process of the field-effect-type semiconductor of this embodiment is the same as the first, second embodiments up to a step indicated in FIG. 7 (however, reference numerals shall be read as "4" instead of "1"). After that, P⁻ source regions 416, P channel region 403, and N⁺ source region 404 are formed successively by ion implantation and heat diffusion. For formation of these regions, the ion implantations are carried out through an appropriate pattern mask. FIG. 38 shows a sectional view of a portion B—B of this state. After that, formation of gate electrodes 406, formation of interlayer dielectric 407, formation of the source electrode 409 and formation of the drain electrode 410 are the same as the first embodiment.

Alternatively, like the third embodiment, it is permissible to form only P⁻ source regions 416 by ion implantation and heat diffusion first and then form the P type silicon layer by epitaxial growth after that. In this case, this P type silicon layer turns to the P channel region 403. After the P channel region 403 is formed, the N⁺ source region 404 is formed by ion implantation and heat diffusion. The process after that is the same. In this way, the field-effect-type semiconductor device of this embodiment is completed.

Similarly to the first to third embodiments, this embodiment can be applied to an electrostatic induction transistor by providing with an N channel region instead of the P channel region 403. Further, this embodiment can be applied to an IGBT by providing with a P⁺ drain region instead of the N⁺ drain region 401.

Variants of the Second-Fourth Embodiments

Figure 39:
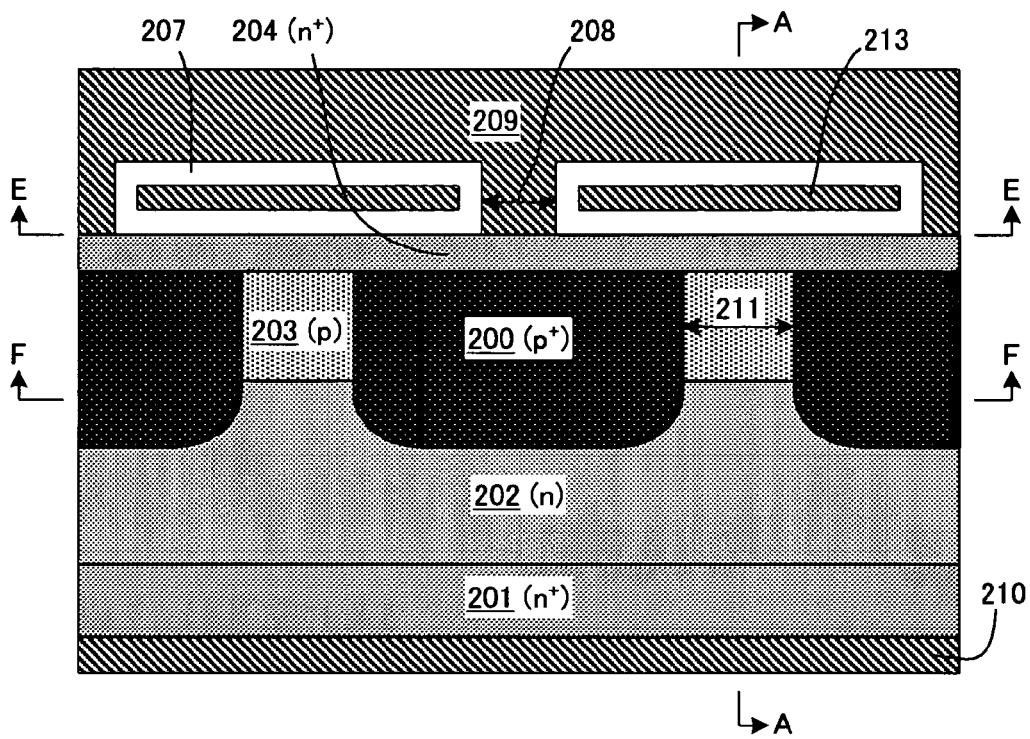
FIG. 39 is an elevation sectional view (portion D—D) showing manufacturing process of a variant for the field-effect-type semiconductor device (power MOS) directed to the second embodiment.

Some variants of the second to fourth embodiments have a feature of an insulated gate-type semiconductor device and a feature of a junction gate-type semiconductor device. FIG. 39 shows such a variant of the second embodiment (portion D—D, corresponding to FIG. 17 of the second embodiment). In the semiconductor device in FIG. 39, compared with the semiconductor device of the second embodiment, effective channel width 211 is narrowed. Consequently, P⁺ source regions 200 act as junction gates for an electrostatic induction-type transistor. That is, this field-effect-type semiconductor device work as an insulated gate-type transistor by gate electrodes 206 and as a junction gate-type transistor by P⁺ source regions 200 (see a sectional view of a portion in FIG. 39). The junction gate-type transistor in a section D—D is in a state that the gate and the source are short-circuited.

A following requirement is necessary for P⁺ source regions 200 to act as junction gates. Namely, assuming that donor concentration of the N drift region 202 is $10^{15}$ cm⁻³, acceptor concentration of the P channel region 203 is $10^{17}$ cm⁻³ and depth of the P channel region 203 is 6 μm, effective channel width 211 needs to be 4 μm or less.

Figure 40:
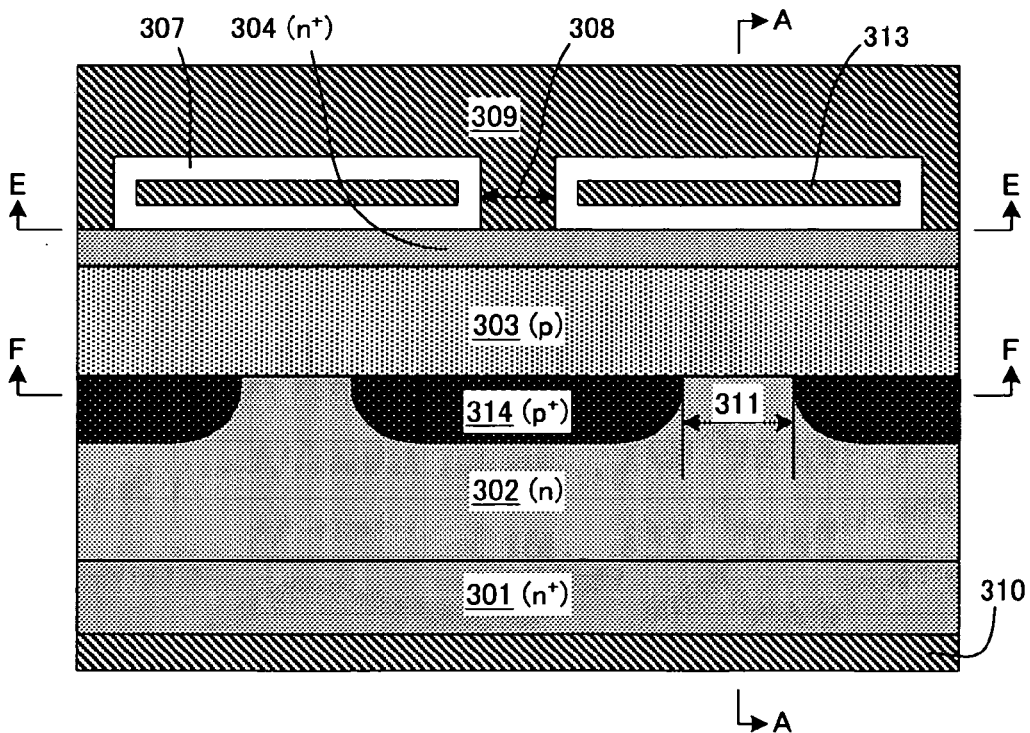
FIG. 40 is an elevation sectional view (portion D—D) showing manufacturing process of a variant for the field-effect-type semiconductor device (power MOS) directed to the third embodiment.

FIG. 40 shows an example that the same variant is applied to the field-effect-type semiconductor device of the third embodiment (portion D—D, corresponding to FIG. 27 of the third embodiment). In this semiconductor device, by narrowing effective channel width 311, P⁺ embedded regions 314 act as junction gates of an electrostatic induction-type transistor.

Further, the same variant can be also applied to the field-effect-type semiconductor device of the fourth embodiment. It may be considered that P⁺ embedded regions 314 in FIG. 40 are replaced with P⁻ source regions 416 and respective reference numerals are read as "4" instead of "3" in the sectional view of a portion D—D. In these variants, interval between gate electrodes does not have to be so small.

Fifth Embodiment

Figure 41:
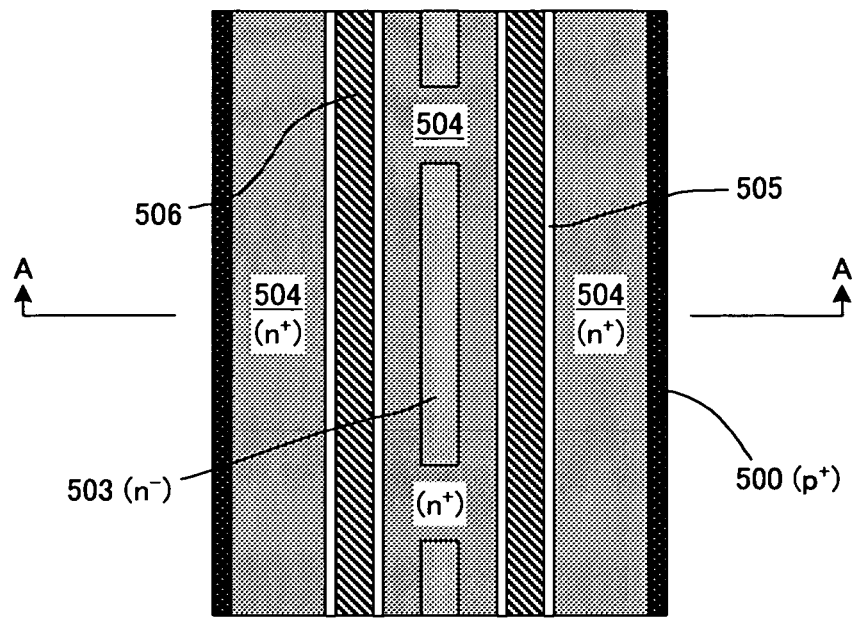
FIG. 41 is a plane sectional view (portion E—E) of structure of an electrostatic-induction-type semiconductor device (unipolar-type electrostatic induction transistor) directed to a fifth embodiment.
Figure 42:
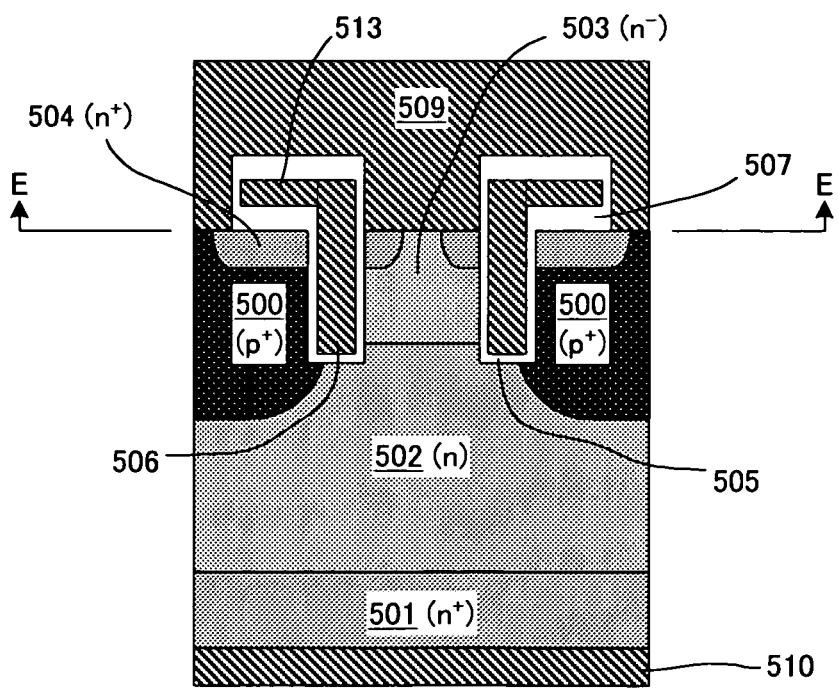
FIG. 42 is an elevation sectional view (portion A—A) of structure of the electrostatic-induction-type semiconductor device (unipolar-type electrostatic induction transistor) directed to the fifth embodiment.

The fifth embodiment is an embodiment of the present invention in the form of an electrostatic induction-type semiconductor device employing both the insulated gate and junction gate. FIG. 41 and FIG. 42 show the structure of the electrostatic induction-type semiconductor device of the fifth embodiment. FIG. 42 is a sectional view of a portion A—A in FIG. 41. FIG. 41 is a sectional view of a portion E—E in FIG. 42. This electrostatic induction-type semiconductor device is so constructed to function as a unipolar-type electrostatic induction transistor. In this electrostatic induction-type semiconductor device, generally, source regions and gate electrodes are provided on the side of the surface (upper section in FIG. 42) of the semiconductor substrate while a drain region and the like are provided on the side of the bottom surface (lower section in FIG. 42).

$P^+$ gate regions 500, $N^+$ source regions 504, and $N^-$ channel regions 503 as well as trench-structured gate electrodes 506 are provided on the side of the surface of the semiconductor substrate. Gate electrodes 506 are insulated from the semiconductor substrate by gate dielectrics 505 and an interlayer dielectric 507. In the meantime, a gate wiring 513 for controlling voltage of gate electrodes 506 is provided in the interlayer dielectric 507.

$N^+$ source regions 504 are formed the shallowest among gate electrodes 506, $P^+$ gate regions 500, $N^+$ source regions 504 and $N^-$ channel regions 503. On the other hand, $P^+$ gate regions 500 are formed the deepest. Gate electrodes 506 and $N^-$ channel regions 503 are formed in an intermediate depth and gate electrodes 506 are slightly deeper than $N^-$ channel regions 503. That is, $P^+$ gate regions 500 are formed deeper than gate electrodes 506. A source electrode 509 is formed above these regions. The source electrode 509 is in contact with $P^+$ gate regions 500, $N^+$ source regions 504 and $N^-$ channel regions 503. Then, an $N^+$ source region 504 and an $N^-$ channel region 503 are in contact with each other. An $N^+$ source region 504 and a $P^+$ gate region 500 are also in contact with each other.

In a plane sectional view of FIG. 41, gate electrodes 506 are formed in a belt-like shape vertically. Also, portions where a $P^+$ gate region 500 and a source electrode 509 make contact each other are formed in a belt-like shape vertically. Contrary, portions where an $N^-$ channel region 503 and the source electrode 509 make contact each other are formed intermittently in the vertical direction. $P^+$ gate regions 500 and $N^-$ channel regions 503 exist alternately in the right and left direction in FIG. 41. Gate electrodes 506 are located between a $P^+$ gate region 500 and an $N^-$ channel region 503.

An N drift region 502 is formed beneath $N^-$ channel regions 503, gate electrodes 506 and $P^+$ gate regions 500. Most of the N drift region 502 is located deeper than the bottom level of gate electrodes 506, such that it is expanded substantially all over the semiconductor substrate. An $N^+$ drain region 501 is provided further beneath the N drift region 502. Then, a drain electrode 510 is formed on the bottom surface of the semiconductor substrate such that it is in contact with the bottom end of the $N^+$ drain region 501.

In the electrostatic induction type semiconductor device of this embodiment, both shallow insulated gates (gate electrodes 506) and deep junction gates ($P^+$ gate regions 500) are used together. Thus, concentration of electrical field at shoulder portions of the wall face and bottom face of gate electrodes 506 is relaxed. Consequently, a high voltage-resistance is achieved. Further, both the N drift region 502 and $N^-$ channel regions 503 are N conduction type. Thus, in the electrostatic induction-type semiconductor device of this embodiment, no parasitic bipolar transistor exists in channel portion. As a result, no latch-up phenomenon occurs, so that the device is hard to destroy.

Figure 43:
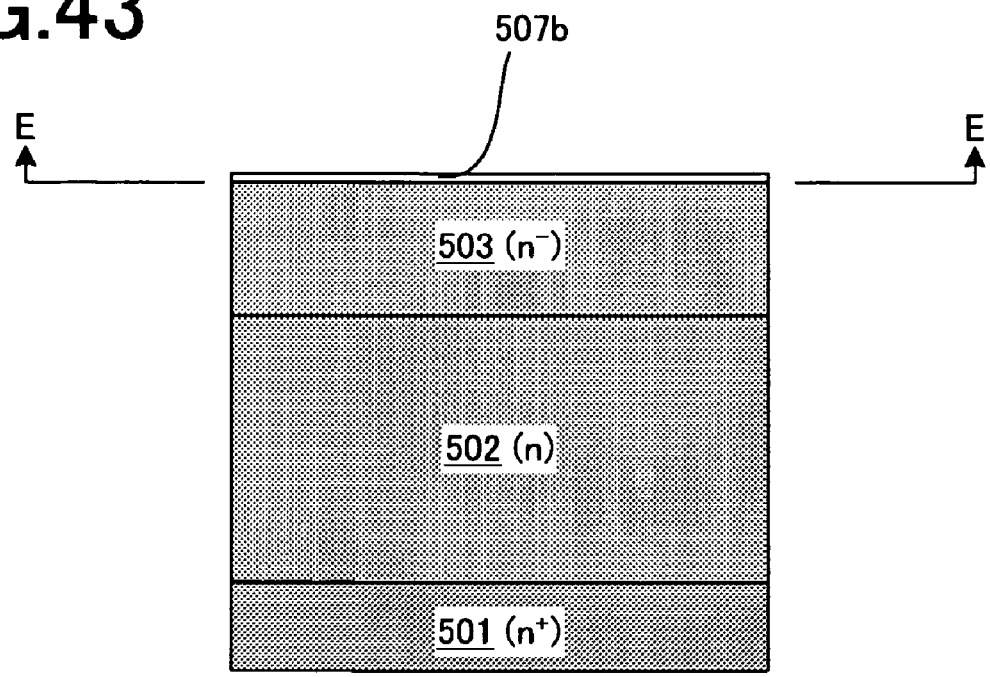
FIG. 43 is an elevation sectional view (1) of portion B—B showing manufacturing process of the electrostatic-induction-type semiconductor device (unipolar-type electrostatic induction transistor) directed to the fifth embodiment.
Figure 44:
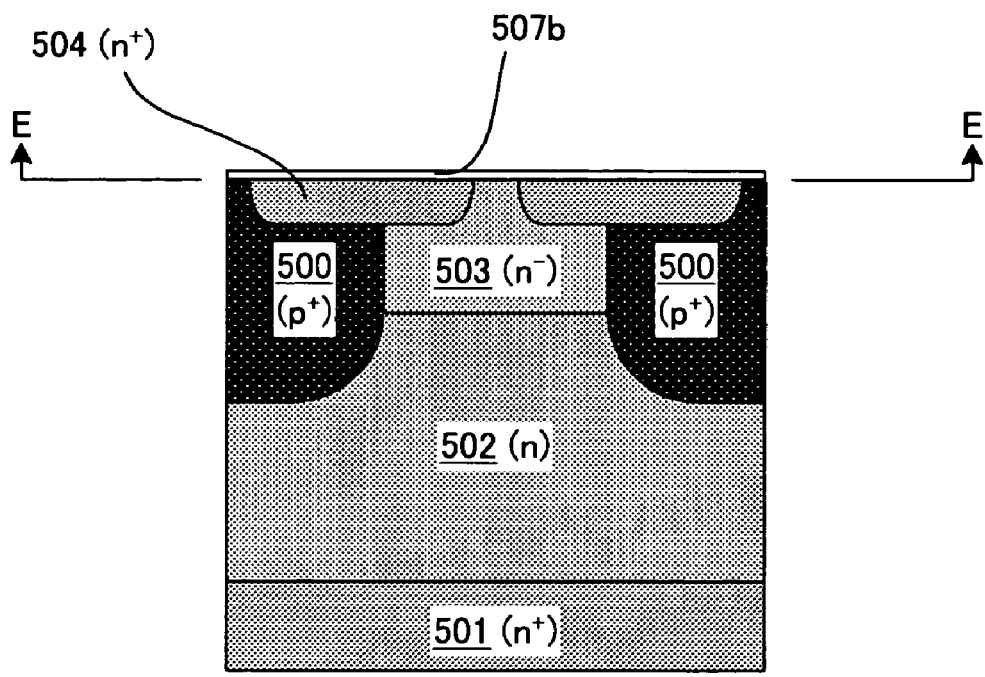
FIG. 44 is an elevation sectional view (2) of portion B—B showing manufacturing process of the electrostatic-induction-type semiconductor device (unipolar-type electrostatic induction transistor) directed to the fifth embodiment.

Manufacturing process of the electrostatic induction-type semiconductor device of this embodiment will be described with reference to FIG. 43 and FIG. 44. For manufacturing of the electrostatic induction-type semiconductor device of this embodiment, an $N^+$ silicon wafer is employed as its starting wafer. $N^+$ silicon of this wafer turns to the $N^+$ drain region 501. Then, N type silicon layer is formed on its surface by epitaxial growth. This N type silicon layer turns to the N drift region 502. Alternatively, an N type silicon wafer may be used as a starting wafer. In this case, N type silicon of the wafer turns to the N drift region 502. Then, an $N^+$ drain region 501 may be formed by introducing N type impurity from the bottom surface or depositing $N^+$ type silicon layer on the bottom surface.

Next, low concentration N type silicon layer is formed on the surface of the N type silicon layer by epitaxial growth. This low concentration N type silicon layer turns to $N^-$ channel regions 503. Next, thermal oxide film of about 700 nm in thickness is formed on the surface of the low concentration N type silicon layer. Then, patterning is made in this thermal oxide film by photolithography and etching. Consequently, the thermal oxide film is left only on a peripheral portion of the wafer. Thus, an opening in which the low concentration N type silicon layer is exposed is formed entirely over a portion in which devices are to be formed. Next, a thermal oxide film 707b is formed on the surface of the low concentration N type silicon layer. Its film thickness is 30 nm. FIG. 43 shows a sectional view of this state. Then, $P^+$ gate regions 500 and $N^+$ source regions 504 are formed successively by ion implantation and heat diffusion. The ion implantations for formation of these regions are carried out through an appropriate pattern mask. FIG. 44 shows a sectional view of this state.

Further, oxide film is deposited on the oxide film 707b by CVD method. Its thickness is 400 nm. Resist pattern is formed on that oxide film by photolithography. This resist pattern is a pattern having openings to form gate electrodes 506. The oxide film is removed by dry etching with this resist pattern as a mask. Consequently, the remaining oxide film serves as a mask for silicon etching. The silicon is etched by dry etching with this oxide film mask. As a result, trenches which go through $N^+$ source regions 504 are formed. Then, the oxide film is removed only at the device corresponding portion by wet etching. After that, thermal oxide film of 100 nm in thickness is formed on wall faces of trenches. This oxide film turns to gate dielectric 505.

Polycrystal silicon film is deposited by the CVD method so that gate electrodes 506 and gate wiring 513 are formed by applying conductivity by phosphorous diffusion. After that, the states indicated in FIG. 41 and FIG. 42 are attained after patterning, formation of the interlayer dielectric 107, formation of the source electrode 509 and formation of the drain electrode 510 in the bottom surface. In this way, the electrostatic induction-type semiconductor device of this embodiment is completed.

In case an N type silicon wafer is employed as a starting wafer, it is permissible to form the structure of the side of the source surface (gate electrodes 506, $P^+$ gate regions 500, source electrode 509 and the like) firstly, and then form the N+drain region 501.

The feature of this embodiment can be applied to a bipolar-type electrostatic induction transistor. This is achieved by providing with a $P^+$ drain region instead of the $N^+$ drain region 501. For this purpose, a $P^+$ silicon wafer is employed as a starting wafer. Alternatively, with an N type silicon wafer as a starting wafer, $P^+$ type silicon layer is formed by introducing P type impurity from the bottom surface or depositing $P^+$ type silicon layer on the bottom surface. Consequently, as produced such, besides voltage-resistance improvement by using both shallow insulated gates and deep junction gates, channel portion includes no parasitic thyrister. Thus, no latch-up phenomenon occurs, so that the device is hard to destroy.

Sixth Embodiment

Figure 45:
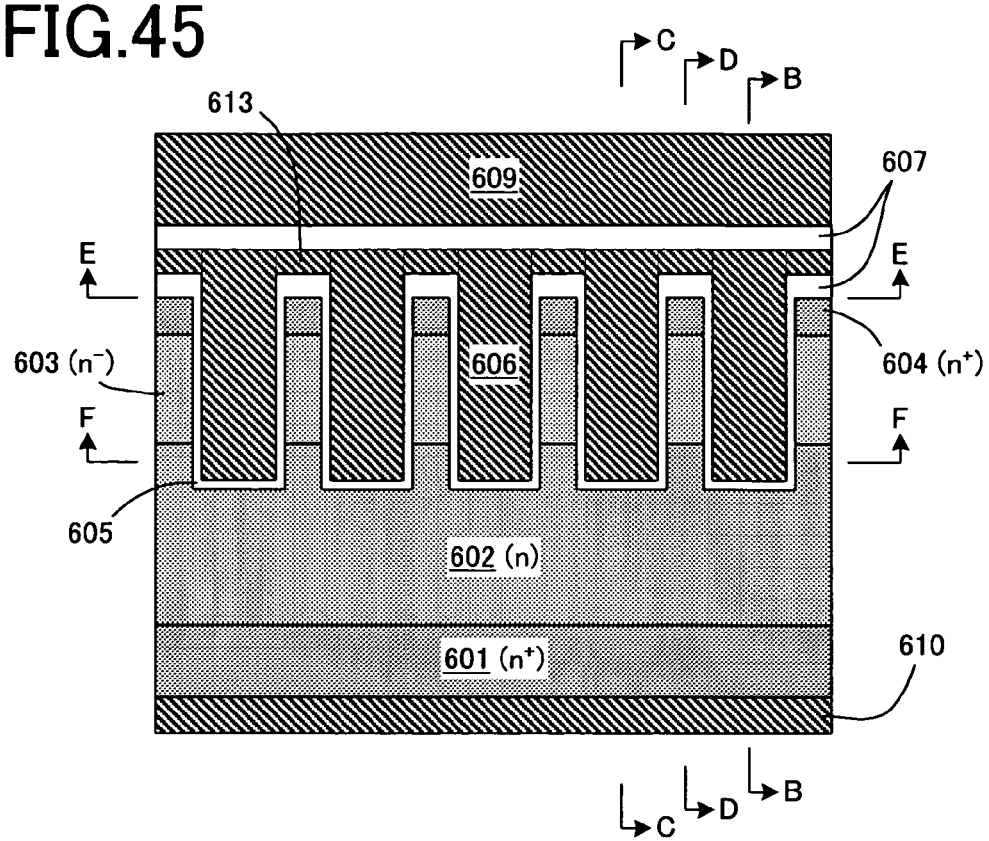
FIG. 45 is an elevation sectional view (portion A—A) of structure of an electrostatic-induction-type semiconductor device (unipolar-type electrostatic induction transistor) directed to a sixth embodiment.
Figure 46:
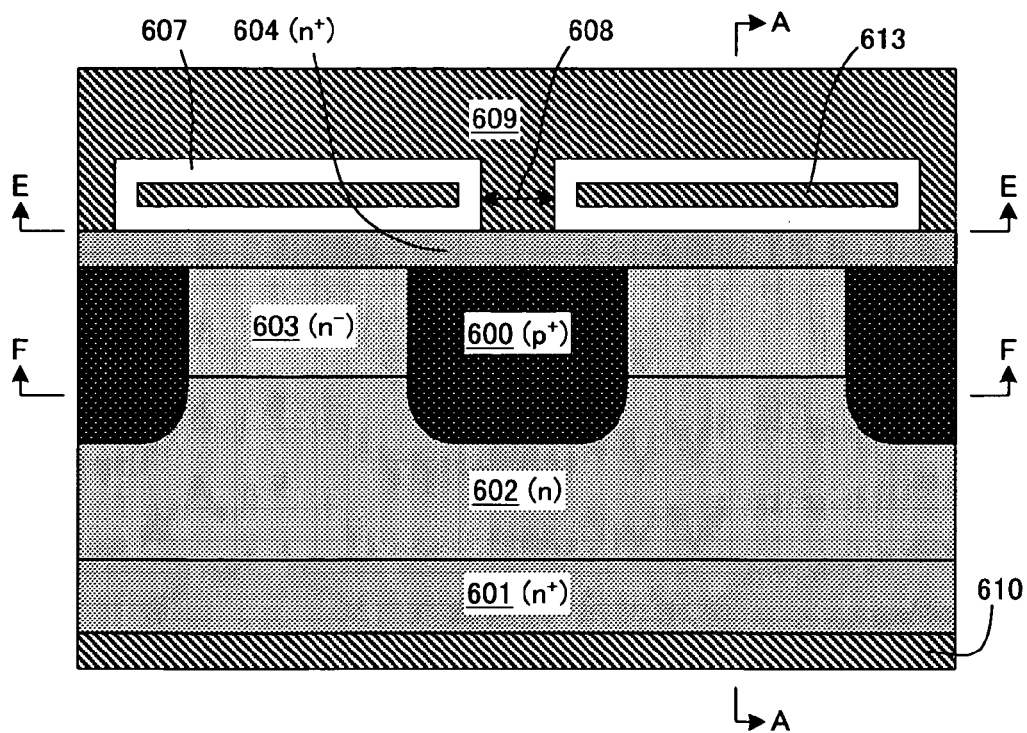
FIG. 46 is an elevation sectional view (portion D—D) of structure of the electrostatic-induction-type semiconductor device (unipolar-type electrostatic induction transistor) directed to the sixth embodiment.

The sixth embodiment is also an embodiment of the present invention in the form of an electrostatic induction-type semiconductor device which employs both insulated gates and junction gates. FIG. 45 and FIG. 46 show the structure of the electrostatic induction-type semiconductor device of the sixth embodiment. FIG. 46 is a sectional view of a portion D—D in FIG. 45. FIG. 45 is a sectional view of a portion A—A in FIG. 46. For the section of a portion E—E in FIG. 45 and FIG. 46, respective reference numerals in FIG. 1 of the first embodiment are read as "6" instead of "1". For the section of a portion F—F in FIG. 45, and FIG. 46, respective reference numerals in FIG. 14 of the second embodiment are read as "6" instead of "2". For the section of a portion B—B in FIG. 45, respective reference numerals in FIG. 15 of the second embodiment shall be read in the same way. For the section of a portion C—C in FIG. 45, the respective reference numerals in FIG. 16 of the second embodiment shall be read in the same way. When FIG. 1 and FIG. 14 through FIG. 16 are referred to in a description of this embodiment below, the reference numerals shall be read in the same way.

This electrostatic induction-type semiconductor device is similar to the field-effect-type semiconductor device of the first to fourth embodiments in terms of the structure. However, this embodiment is so constructed functionally as a unipolar-type electrostatic induction transistor and is rather common to the fifth embodiment. That is, the place of the P channel region in the first to fourth embodiments is used as an N⁻ channel region 603. Consequently, the P⁺ region which functions as a source region in the first to fourth embodiments serves as a P⁺ gate region 600 which functions as a junction gate. Like the fifth embodiment, the P⁺ gate region 600 is formed deeper than gate electrodes 606 (see FIG. 15 and FIG. 16 while the reference numerals shall be read in the above-mentioned manner). In the electrostatic induction-type semiconductor device of this embodiment, gate electrodes 606 and P⁺ gate regions 606 are formed such that they cross each other (may cross not at right angle); different from that gate electrodes 506 and P⁺ gate regions 500 are formed in parallel in the fifth embodiment.

For this reason, also in the electrostatic induction-type semiconductor device of this embodiment, concentration of electrical field at shoulder portions of wall faces and bottom face of gate electrodes 606 is relaxed by using both shallow insulated gates (gate electrodes 606) and deep junction gates (P⁺ gate regions 600). Consequently, a high voltage-resistance is achieved. Further, because both the N drift region 602 and N⁻ channel region 603 are of N conduction type, no parasitic bipolar transistor exists at the channel portion. Thus, no latch-up phenomenon occurs, so that the device is hard to destroy.

Further, in the electrostatic induction-type semiconductor device of this embodiment, P⁺ gate regions 600 are in direct contact with the N⁻ channel region 603 (FIG. 46). Consequently, though having junction gates, the semiconductor device has normally-OFF characteristic even in voltage control. The reason is that in its operating condition, PN junction between P⁺ gate regions 600 and N⁺ source regions 604 becomes forward. Thus, P⁺ gate regions 600 have the same potential as N⁺ source regions 604. Because this P⁺ gate region 600 is in a direct contact with the N⁻ channel region 603, the channel portion gets depleted even if the potential of gate electrodes 606 is zero. Further, this is because electron current from N⁺ source regions 604 is interrupted by built-in potential in P⁺ gate regions 600. In this way, a semiconductor device having an excellent OFF characteristic is achieved. In the meanwhile, potential of the N⁻ channel region 603 can be controlled by potential of gate electrodes 606 which is deeper than the N⁻ channel region 603 and shallower than P⁺ gate regions 600. Consequently, ON state in which electrons are injected into the N drift region 602 can be obtained.

The electrostatic induction-type semiconductor device of this embodiment contains a plurality of gate electrodes each having a rectangular section disposed in the form of grids like the field-effect-type semiconductor device of the first to fourth embodiments. Thus, this embodiment has such an effect that its channel concentration is high while its ON-resistance is very small.

Manufacturing process of the electrostatic induction-type semiconductor device of this embodiment is basically the same as the fifth embodiment except that the mask pattern for formation of each region is different.

The feature of this embodiment also can be applied to a bipolar-type electrostatic induction transistor. This is achieved by providing with a P⁺ drain region instead of the N+drain region 601. Consequently, it has such an effect that no parasitic thyrister exists at the channel portion in addition to improvement in voltage-resistance, improvement in OFF characteristic, effect of low ON-resistance and the like. For the reason, no latch-up phenomenon occurs, so that the device is hard to destroy.

Variant of the Sixth Embodiment

Figure 47:
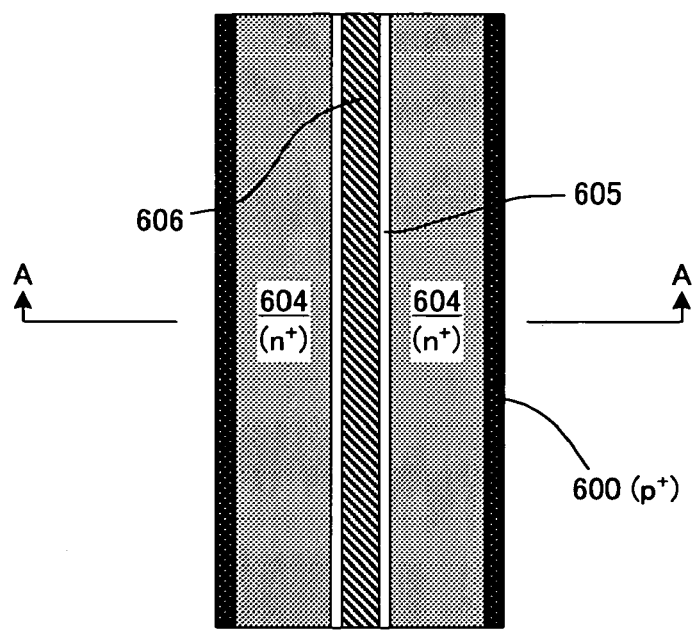
FIG. 47 is an elevation sectional view (portion A—A) of structure of a variant (1) for the unipolar-type electrostatic induction transistor directed to the sixth embodiment.
Figure 48:
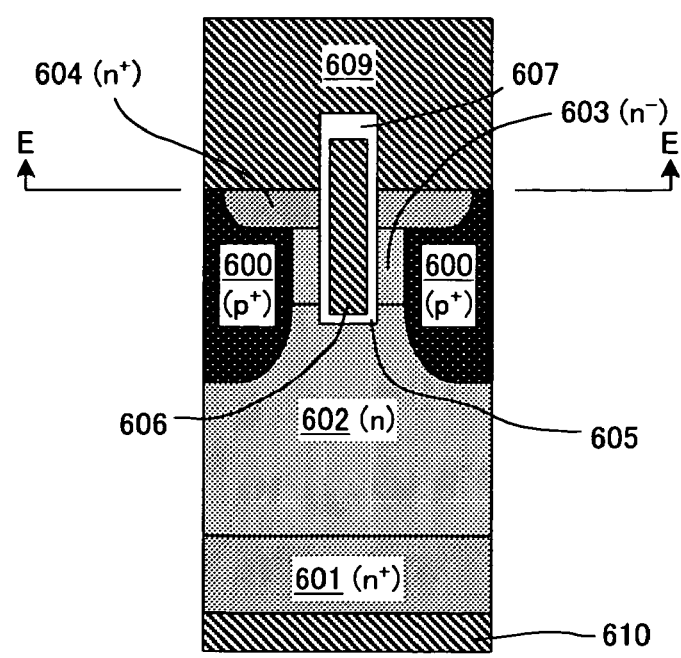
FIG. 48 is a plane sectional view (portion E—E) of structure of the variant (1) for the unipolar-type electrostatic induction transistor directed to the sixth embodiment.

There is proposed a variant of the sixth embodiment of the electrostatic induction-type semiconductor device in which its gate electrodes 606 are formed in a belt-like shape. FIG. 47 and FIG. 48 show such a variant. FIG. 48 is a sectional view of a portion A—A in FIG. 47. FIG. 47 is a sectional view of a portion E—E in FIG. 48. This electrostatic induction-type semiconductor device functions as a unipolar-type electrostatic induction transistor. This variant has such an effect that the channel portion contains no parasitic bipolar transistor in addition to improvement in voltage-resistance and improvement in OFF characteristic. Of course, this variant can be turned to a bipolar-type electrostatic induction transistor by providing with a P⁺ drain region instead of the N⁺ drain region 601.

Figure 49:
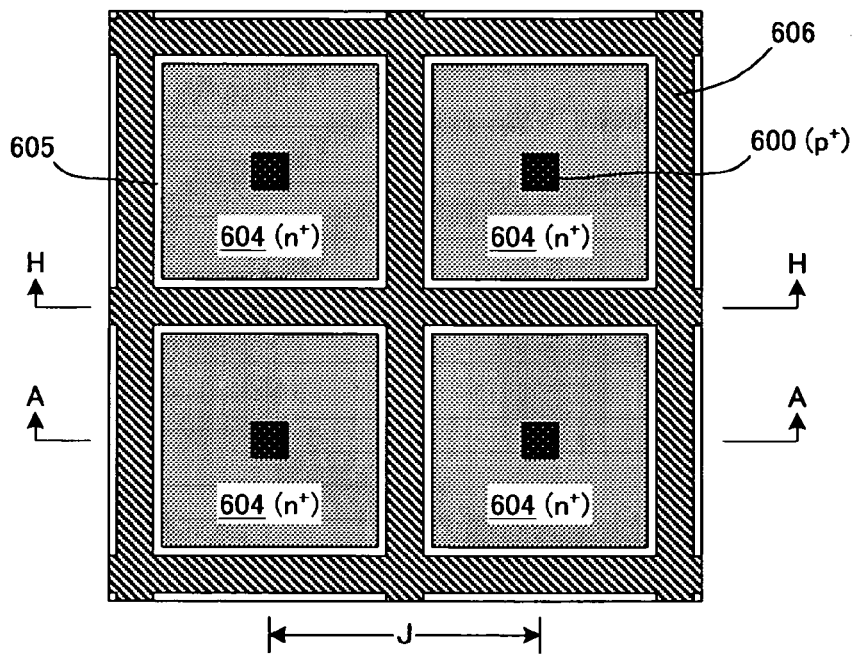
FIG. 49 is a plane sectional view (portion E—E) of structure of a variant (2) for a unipolar-type electrostatic induction transistor directed to the sixth embodiment.
Figure 53:
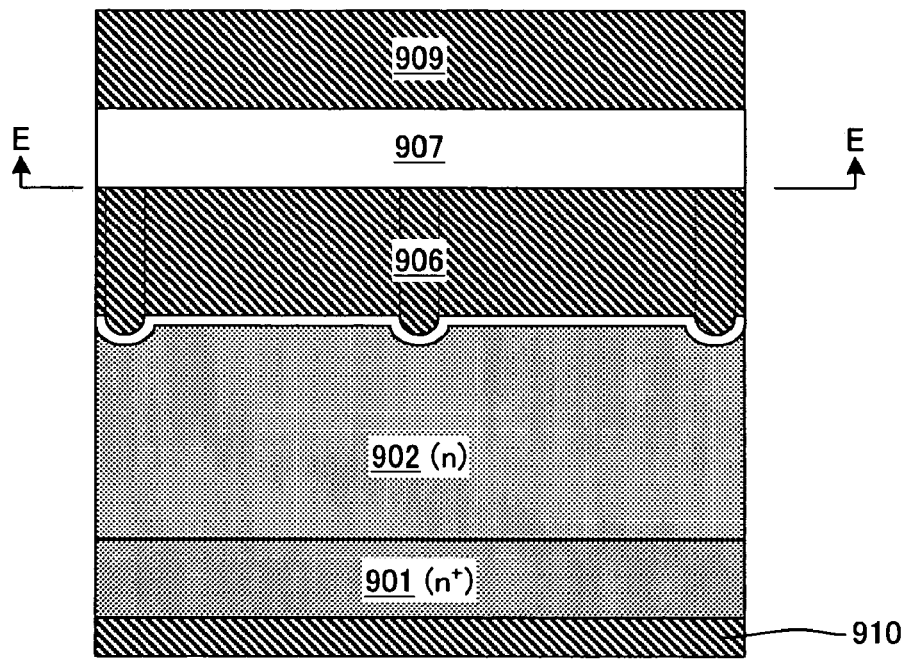
FIG. 53 is an elevation sectional view (portion H—H) of structure of another conventional buried-gate-type semiconductor device.
Figure 54:
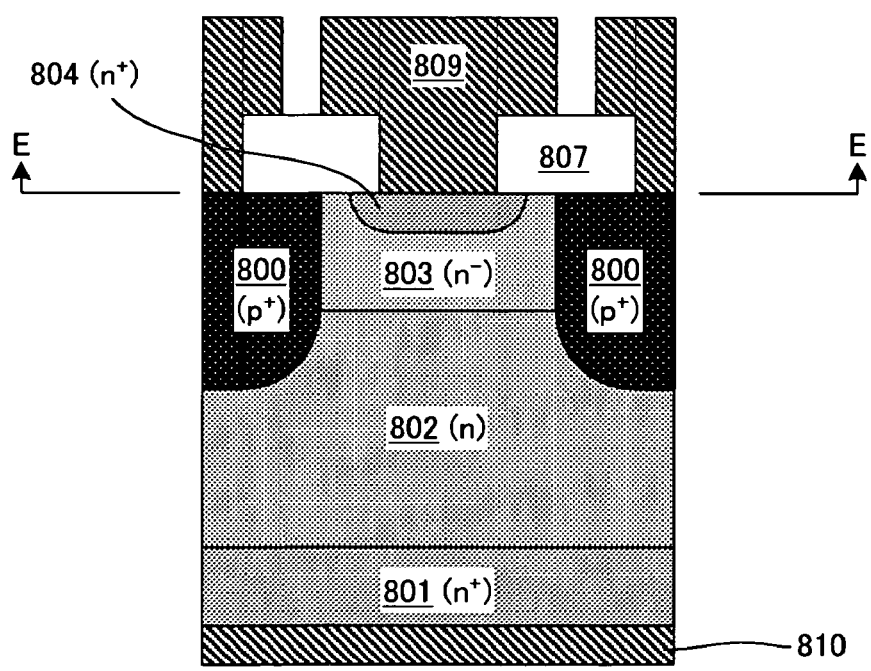
FIG. 54 is an elevation sectional view of structure of still another conventional buried-gate-type semiconductor device.

There is proposed another variant of the sixth embodiment of the electrostatic induction-type semiconductor device in which gate electrode 606 is formed in cross-striped shape. FIG. 49 shows such a variant. The section of a portion H—H in FIG. 49 is the same as that in FIG. 53 indicating the conventional art already described (respective reference numerals shall be read as "6" instead of "9"). FIG. 49 is a sectional view of a portion E—E in FIG. 53. A range indicated with an arrow J in the section of the portion A—A in FIG. 49 is the same as FIG. 48. This electrostatic induction-type semiconductor device functions as a unipolar-type electrostatic induction transistor. This variant has such an effect that the channel portion has no parasitic bipolar transistor in addition to improvement in voltage-resistance, improvement in OFF characteristic and low ON-resistance. Particularly, in the semiconductor device having such cross-striped gate electrode 606, concentration of electrical field at crossing points of the gate electrode 606 is likely to be problematic. Therefore, improvement in voltage-resistance by P+ gate regions 600 located deeper than the gate electrode 606 has a profound meaning.

Of course, this variant can be turned to a bipolar-type electrostatic induction transistor by providing with a P+ drain region instead of the N+ drain region 601. Further, the shape of the cross-striped gate electrode 606 is not restricted to square but may be rectangular, diamond or parallelogram. Further, it may be triangular or hexagon.

The respective embodiments described above are mere exemplifications and never restricts the present invention. Thus, needless to say, in addition to the above-described embodiments, the present invention may be improved or modified in various ways within a range not departing from the gist of the present invention.

In the semiconductor devices of the first through fourth and sixth embodiments, the angle between the length direction of contact openings (108 or the like) and the long side of gate electrodes (106 or the like) in FIG. 1, FIG. 22, FIG. 33 is not restricted to right angle but may be oblique except parallel to each other. Further, impurity concentration in the N drift region (102 or the like) does not always have to be uniform. As required, it is permissible to provide with a difference in density within the N drift region (102 or the like). For example, it can be considered to provide a portion adjoining the N+ drain region (101 or the like or P+ drain region) with a portion having a relatively high density (called buffer region).

Further, the present invention can be applied to other kinds of the field-effect-type semiconductor device or electrostatic induction-type semiconductor device such as MOS gate thyrister. Needless to say, the present invention can be applied to a semiconductor device employing other semiconductor (SiC, GaN, GaAs or the like) than silicon. Further, silicon nitride or aluminum oxide may be used as dielectric, as well as silicon oxide. Further, it is permissible to employ opposite conduction-type semiconductor in which the P type and N type are exchanged with each other or a complimentary-type semiconductor in which both are combined may be used. Additionally, the vertical sectional shape of the gate electrode (106 or the like) is not restricted to vertical, but may be oblique. Further, the buried type is not restricted to trench type but may be concave-type or the like as long as the structure is buried in the substrate surface.

In the semiconductor devices of the first to fourth and sixth embodiments, the plan sectional shape of gate electrodes (106 or the like) is not restricted to rectangular, but may be elliptical (it is regarded that its major axis is long side and its minor axis is short side) triangular or other polygon. Further gate electrodes (106 or the like) may be semiconductor of opposite-conductive-type to the drift region (102 or the like) or may be metal. Further, insulated gate/junction gate combined type semiconductor devices, described in the fifth and sixth embodiments, can be provided with N+ embedded regions and P+ embedded regions like the third embodiment. That is, an N− type is employed instead of the P channel region 303 in the third embodiment.

In the semiconductor devices of the first to fourth embodiments, the P channel region (103 or the like) may be replaced with a semiconductor region (P− type, N− type, or I type) having impurity concentration lower than the impurity concentration of the N drift region (102 or the like). Consequently, when the voltage of gate electrodes (106 or the like) is zero or opposite bias, the corresponding channel region entirely can be depleted. By such concentration setting, an electrostatic-induction-type transistor having normally-OFF characteristic can be obtained. In such an electrostatic induction-type transistor, while its OFF characteristic is excellent, current at ON time flows through the entire channel region. For the reason, there is an advantage that loss at ON time is small.

As evident from the above description, the present invention provides a buried gate-type semiconductor device in which its gate interval is minimized so as to improve the channel concentration thereby realizing a low ON-resistance. Further, the present invention provides a buried gate-type semiconductor device in which voltage-resistance depression due to concentration of electrical field in the vicinity of the bottom of gate is prevented. Still further, the present invention provides a buried gate-type semiconductor device in which prevention of voltage-resistance depression and OFF characteristic are achieved at the same time.

What is claimed is:

1. A buried-gate-type semiconductor device comprising:
a semiconductor substrate;
a first one-conduction-type semiconductor region formed in the semiconductor substrate;
a first other-conduction-type semiconductor region formed above of the first one-conduction-type semiconductor region;
a plurality of buried gates buried in the semiconductor substrate penetrating the first other-conduction-type semiconductor region, the buried gates having long sides and short sides intersecting to one another in a section parallel to a surface of the semiconductor substrate, and being arranged repeatedly along at least short-side direction;
a second one-conduction-type semiconductor region formed at a surface side of the first other-conduction-type semiconductor region;
a second other-conduction-type semiconductor region having a bottom portion deeper than a bottom portion of buried gates, the second other-conduction-type semiconductor region being at least formed at a side portion of a buried gate's short side; and
a wiring layer,
wherein a contact portion at which the second one-conduction-type semiconductor region and the wiring layer are in contact with each other is arranged at a buried gate's short side.

2. A buried-gate-type semiconductor device according to claim 1, wherein the second other-conduction-type semiconductor region covers a shoulder portion that is a cross portion of a side surface at a side of a buried gate's short side and a bottom surface of the buried gate.

3. A buried-gate-type semiconductor device according to claim 1, wherein buried gates are arranged repeatedly along a long-side direction as well, and an interval between a buried gate's long side and another buried gate's long side is shorter than an interval between a buried gate's short side and another buried gate's short side.

4. A buried-gate-type semiconductor device according to claim 1 further comprising a bottom-surface other-conduction-type semiconductor region at a bottom face of the first one-conduction-type semiconductor region, opposite to the first other-conduction-type semiconductor region.

5. A buried-gate-type semiconductor device comprising:
a semiconductor substrate;
a first one-conduction-type semiconductor region formed in the semiconductor substrate;
a channel semiconductor region of other-conduction-type formed above of the first one-conduction-type semiconductor region;
a plurality of buried gates buried in the semiconductor substrate penetrating the channel semiconductor region, the buried gates having long sides and short sides intersecting to one another in a section parallel to a surface of the semiconductor substrate, and being arranged repeatedly at least along short-side direction;

a second one-conduction-type semiconductor region formed at a surface side of the channel semiconductor region;

an embedded other-conduction-type semiconductor region having a bottom portion deeper than a bottom portion of buried gates, the embedded other-conduction-type semiconductor region being at least formed at a side portion of a buried gate's short side; and a wiring layer, wherein a contact portion at which the second one-conduction-type semiconductor region and the wiring layer are in contact with each other is arranged at a buried gate's short side.

6. A buried-gate-type semiconductor device according to claim 5, wherein the embedded other-conduction-type semiconductor region covers a shoulder portion that is a cross portion of a side surface at a side of a buried gate's short side and a bottom surface of the buried gate.

7. A buried-gate-type semiconductor device according to claim 5, wherein buried gates are arranged repeatedly along a long-side direction as well, and an interval between a buried gate's long side and another buried gate's long side is shorter than an interval between a buried gate's short side and another buried gate's short side.

8. A buried-gate-type semiconductor device according to claim 5 further comprising a bottom-surface other-conduction-type semiconductor region at a bottom face of the first one-conduction-type semiconductor region, opposite to the channel semiconductor region.

9. A buried-gate-type semiconductor device comprising:
a semiconductor substrate;
a first one-conduction-type semiconductor region formed in the semiconductor substrate;
a channel semiconductor region formed above of the first one-conduction-type semiconductor region;
a plurality of buried gates buried in the semiconductor substrate penetrating the channel semiconductor region, the buried gates having long sides and short sides intersecting to one another in a section parallel to a surface of the semiconductor substrate, and being arranged repeatedly at least along short-side direction;
a second one-conduction-type semiconductor region formed at a surface side of the channel semiconductor region;
a gate-side-portion other-conduction-type semiconductor region having a bottom portion deeper than a bottom portion of buried gates, the gate-side-portion other-conduction-type semiconductor region being at least formed at a side portion of a buried gate's short side; and
a wiring layer,
wherein a contact portion at which the second one-conduction-type semiconductor region and the wiring layer are in contact with each other is arranged at a buried gate's short side,
impurity concentration at between buried gates in the channel semiconductor region is lower than impurity concentration at the first one-conduction-type semiconductor region, and
entirety of the channel semiconductor region gets depleted in case applied voltage to buried gates is 0 or opposite bias.

10. A buried-gate-type semiconductor device according to claim 9, wherein the gate-side-portion other-conduction-type semiconductor region covers a shoulder portion that is a cross portion of a side surface at a side of a buried gate's short side and a bottom surface of the buried gate.

11. A buried-gate-type semiconductor device according to claim 9, wherein buried gates are arranged repeatedly along a long-side direction as well, and an interval between a buried gate's long side and another buried gate's long side is shorter than an interval between a buried gate's short side and another buried gate's short side.

12. A buried-gate-type semiconductor device according to claim 9 further comprising a bottom-surface other-conduction-type semiconductor region at a bottom face of the first one-conduction-type semiconductor region, opposite to the channel semiconductor region.

13. A buried-gate-type semiconductor device comprising:
a semiconductor substrate;
a first one-conduction-type semiconductor region formed in the semiconductor substrate;
a channel semiconductor region formed above of the first one-conduction-type semiconductor region;
a plurality of buried gates buried in the semiconductor substrate penetrating the channel semiconductor region, the buried gates having long sides and short sides intersecting to one another in a section parallel to a surface of the semiconductor substrate, and being arranged repeatedly at least along short-side direction;
a second one-conduction-type semiconductor region formed at a surface side of the channel semiconductor region;
an embedded other-conduction-type semiconductor region having a bottom portion deeper than a bottom portion of buried gates, the embedded other-conduction-type semiconductor region being at least formed at a side portion of a buried gate's short side; and
a wiring layer,
wherein a contact portion at which the second one-conduction-type semiconductor region and the wiring layer are in contact with each other is arranged at a buried gate's short side,
impurity concentration at between buried gates in the channel semiconductor region is lower than impurity concentration at the first one-conduction-type semiconductor region, and
entirety of the channel semiconductor region gets depleted in case applied voltage to buried gates is 0 or opposite bias.

14. A buried-gate-type semiconductor device according to claim 13, wherein the embedded other-conduction-type semiconductor region covers a shoulder portion that is a cross portion of a side surface at a side of a buried gate's short side and a bottom surface of the buried gate.

15. A buried-gate-type semiconductor device according to claim 13, wherein buried gates are arranged repeatedly along a long-side direction as well, and an interval between a buried gate's long side and another buried gate's long side is shorter than an interval between a buried gate's short side and another buried gate's short side.

16. A buried-gate-type semiconductor device according to claim 13 further comprising a bottom-surface other-conduction-type semiconductor region at a bottom face of the first one-conduction-type semiconductor region, opposite to the channel semiconductor region.

17. A buried-gate-type semiconductor device comprising:
a semiconductor substrate;

a first one-conduction-type semiconductor region formed in the semiconductor substrate;

a channel semiconductor region formed above the first one-conduction-type semiconductor region;

a buried gate facing the channel semiconductor region, the buried gate reaching the first one-conduction-type semiconductor region; and an other-conduction-type semiconductor region formed in the semiconductor substrate between the channel semiconductor region and the first one-conduction-type semiconductor region, the other-conduction-type semiconductor region having a bottom portion deeper than a bottom portion of the buried gate and facing the buried gate.

18. A buried-gate-type semiconductor device according to claim 17, wherein impurity concentration in the channel semiconductor region is lower than impurity concentration at the first one-conduction-type semiconductor region, and entirety of the channel semiconductor region gets depleted in case applied voltage to the buried gate is 0 or opposite bias.

19. A buried-gate-type semiconductor device according to claim 17 further comprising a bottom-surface other-conduction-type semiconductor region at a bottom face of the first one-conduction-type semiconductor region, opposite to the channel semiconductor region.

20. A buried-gate-type semiconductor device according to claim 18 further comprising a bottom-surface other-conduction-type semiconductor region at a bottom face of the first one-conduction-type semiconductor region, opposite to the channel semiconductor region.

* * * * *